US010910815B2

(12) United States Patent
Matsushita et al.

(10) Patent No.: US 10,910,815 B2
(45) Date of Patent: Feb. 2, 2021

(54) ELECTRONIC CONTROL UNIT

(71) Applicant: Hitachi Automotive Systems, Ltd., Hitachinaka (JP)

(72) Inventors: Takayasu Matsushita, Hitachinaka (JP); Yoshihisa Fujii, Hitachinaka (JP)

(73) Assignee: Hitachi Automotive Systems, Ltd., Hitachinaka (JP)

(*) Notice: Subject to any disclaimer, the term of this patent is extended or adjusted under 35 U.S.C. 154(b) by 0 days.

(21) Appl. No.: 16/604,909

(22) PCT Filed: Mar. 26, 2018

(86) PCT No.: PCT/JP2018/012143
§ 371 (c)(1),
(2) Date: Oct. 11, 2019

(87) PCT Pub. No.: WO2018/198631
PCT Pub. Date: Nov. 1, 2018

(65) Prior Publication Data
US 2020/0059082 A1    Feb. 20, 2020

(30) Foreign Application Priority Data

Apr. 25, 2017    (JP) ................................. 2017-086680

(51) Int. Cl.
 *H02H 3/00*    (2006.01)
 *H02H 1/00*    (2006.01)
 *B60R 16/02*    (2006.01)
(52) U.S. Cl.
 CPC ............ *H02H 3/00* (2013.01); *H02H 1/0007* (2013.01); *B60R 16/02* (2013.01)
(58) Field of Classification Search
 CPC .......... H02H 3/00; H02H 3/042; H02H 3/044; H02H 3/08; H02H 3/10; H02H 3/105;
 (Continued)

(56) References Cited

U.S. PATENT DOCUMENTS

| 10,840,900 B2* | 11/2020 | Colarossi ................. H02H 3/16 |
| 2008/0086250 A1* | 4/2008 | Kuivenhoven ..... B60R 21/0173 701/45 |
| 2019/0257872 A1* | 8/2019 | Colarossi ............ B60R 21/0173 |

FOREIGN PATENT DOCUMENTS

| JP | 2008-92277 A | 4/2008 |
| JP | 2009-164933 A | 7/2009 |
| JP | 2014-225780 A | 12/2014 |

OTHER PUBLICATIONS

International Search Report (PCT/ISA/210) issued in PCT Application No. PCT/JP2018/012143 dated Jul. 17, 2018 with English translation (two (2) pages).

(Continued)

*Primary Examiner* — Nguyen Tran
(74) *Attorney, Agent, or Firm* — Crowell & Moring LLP

(57) ABSTRACT

An electronic control unit having a self-diagnosis function is realized in which an operation processing section is capable of identifying not only the presence or absence of the occurrence of NG of disconnection, an earth fault, and a power fault, but also three states of NG, OK, and indetermination. Therefore, when a diagnosis opportunity is present, a mask signal maintains a state of Not Mask even if the mask signal is subsequently brought into a mask state. When an operation processing device requests a drive circuit for communication therewith, the mask signal is set to the state of Mask, and information stored in a register is cleared. Further, when the mask signal is in the state of Mask when the operation processing device performs communication with the drive circuit, the operation processing device is capable of identifying that an indeterminate state free of the opportunity of the diagnosis is present.

11 Claims, 13 Drawing Sheets

(58) Field of Classification Search
CPC ............ H02H 3/14; H02H 3/16; H02H 3/167;
H02H 5/10; H02H 5/105
USPC ......... 361/42, 43, 49, 50, 56, 57, 63, 65, 67
See application file for complete search history.

(56) References Cited

OTHER PUBLICATIONS

Japanese-language Written Opinion (PCT/ISA/237) issued in PCT Application No. PCT/JP2018/012143 dated Jul. 17, 2018 (three (3) pages).

* cited by examiner

ELECTRONIC CONTROL UNIT

TECHNICAL FIELD

The present invention relates to an electronic control unit which drives an electromagnetic load through a switching element and detects disconnection, a power fault, and an earth fault between the electromagnetic load and a drive circuit.

BACKGROUND ART

In an electronic control unit, an FET (Field Effect Transistor) has been widely used as a driving element which performs a switching operation, based on a drive signal from an operation processing device to thereby drive and control electromagnetic loads such as a relay, a solenoid, and a heater.

Generally, as a drive circuit using an FET, there have been known a low side drive circuit in which a power supply, a load, an FET, and a power ground are connected in this order, and a high side drive circuit in which a power supply, an FET, a load, and a power ground are connected in this order. The FETs of these drive circuits are switching-controlled to thereby control energization and non-energization to an electromagnetic load, thus making it possible to drive and control the electromagnetic load.

There is a case where these electronic control units are required to have a diagnosis function of specifying abnormality detection of the drive circuit and its abnormality mode from the viewpoint of an improvement in safety or maintainability. Here, the abnormality mode is indicative of an electrical open path between the electromagnetic load and the drive circuit (disconnection), a short circuit of a line connecting between the load and the drive circuit to ground (earth fault), and a short circuit of the line connecting between the load and the drive circuit to the power supply (power fault).

There has been proposed in Patent Literature 1, a technology of providing a drive circuit which compares a voltage value at the turning OFF of an FET signal and a predetermined threshold to thereby make it possible to accurately distinguish disconnection, a power fault, and an earth fault from each other and discriminate them in both of the case where the drive circuit is configured as the low side drive circuit and the case where the drive circuit is configured as the high side drive circuit.

Further, as a technology of preventing abnormality mode diagnosis from being mis-detected, there has also been proposed in Patent Literature 2, a technology of masking detection processing of an abnormality.

CITATION LIST

Patent Literature

Patent Literature 1: Japanese Patent Application Laid-Open No. 2008-092277
Patent Literature 2: Japanese Patent Application Laid-Open No. 2014-225780

SUMMARY OF INVENTION

Technical Problem

As on-vehicle self-diagnosis requests of a vehicle, the vehicle has recently been required to identify not only the presence or absence of the occurrence of NG of disconnection, an earth fault, and a power fault, which has been demanded so far, but also three states of NG, OK, and indeterminate.

In Patent Literature 2, however, the three states of NG, OK, and indetermination of the disconnection, the earth fault, and the power fault can be identified by the drive circuit, but a means of identifying the three states by an operation processing device is not described therein, and such a technology has not been established.

That is, since a driving period of the operation processing device is slower than that of the drive circuit, the diagnosis is performed, but at the time of communication of the operation processing device with the drive circuit, a mask signal may rise. In such a case, the operation processing device is not capable of identifying whether an indeterminate state (the opportunity of diagnosis is absent) is present, or whether the diagnosis opportunity is present and the diagnosis is performed.

If the operation processing section is capable of accurately identifying whether the indeterminate state is present, a diagnostic result made in other than the indeterminate state can be effectively utilized, and self-diagnosis of high accuracy can be executed.

An object of the present invention is to realize an electronic control unit having a self-diagnosis function in which an operation processing section is capable of identifying not only the presence or absence of the occurrence of NG of disconnection, an earth fault, and a power fault, but also three states of NG, OK, and indetermination.

Solution to Problem

In order to achieve the above object, the present invention is configured in the following manner.

An electronic control unit includes a drive circuit which has a measurement unit measuring a voltage of an end of an electromagnetic load connected to a power supply or ground, or a current of the electromagnetic load, and determining whether an abnormality occurs, and a storage unit storing therein abnormality occurrence information and information for distinguishing between a state in which the abnormality is not generated and a state in which the abnormality cannot be diagnosed, on the basis of a measurement output of the measurement unit, and which drives the electromagnetic load; and an operation processing section which transmits an ON/OFF command signal for driving the electromagnetic load to the drive circuit, acquires the information for distinguishing between the state in which the abnormality is not generated and the state in which the abnormality cannot be diagnosed, from the storage unit of the drive circuit, and determines the occurrence of the abnormality and the non-occurrence thereof to perform abnormality diagnosis.

Advantageous Effects of Invention

According to the present invention, an electronic control unit having a self-diagnosis function can be achieved in which an operation processing section is capable of identifying not only the presence or absence of the occurrence of NG of disconnection, an earth fault, and a power fault, but also three states of NG, OK, and indetermination.

DESCRIPTION OF EMBODIMENTS

Embodiments of the present invention will hereinafter be described in detail using the drawings.

EMBODIMENTS

First Embodiment

A first embodiment of the present invention will be described in detail using FIGS. 1 to 8.

Figure 1:
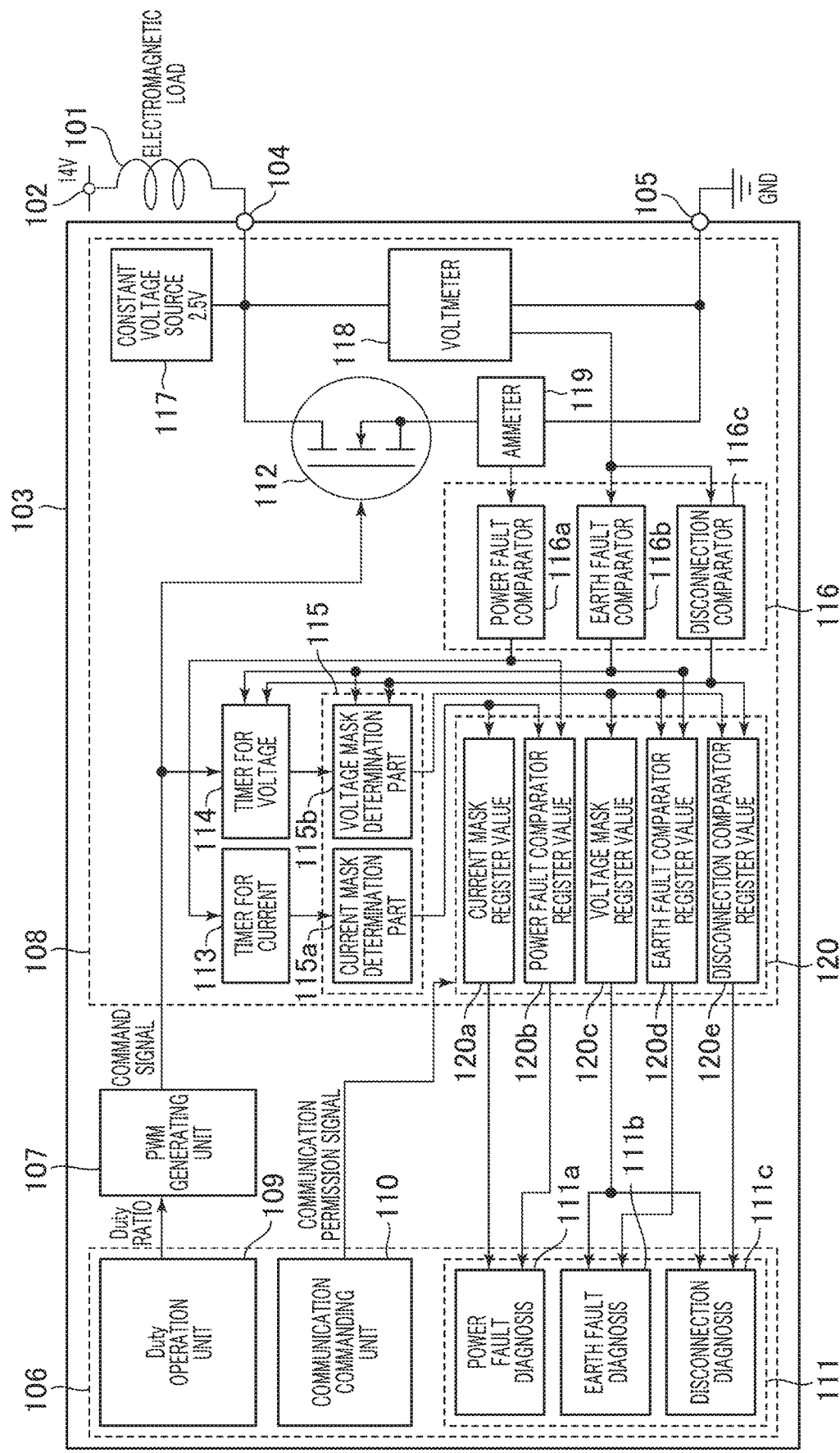
FIG. 1 is an overall schematic configuration diagram of an electronic control unit (applied to a low side driving system) of a first embodiment according to the present invention.

FIG. 1 is an overall schematic configuration diagram of an electronic control unit 103 (applied to a low side driving system) of the first embodiment according to the present invention.

In FIG. 1, one end of an electromagnetic load 101 is connected to a power supply 102 (voltage 14V), and the other end thereof is connected to an electromagnetic load drive output terminal 104 being a terminal for connection with the electronic control unit (ECU) 103. The ECU 103 includes the electromagnetic load drive output terminal 104, a ground connection terminal 105, an operation processing device (operation processing section) 106, a PWM generating unit 107, and a drive circuit 108.

The operation processing device 106 includes a Duty operation unit 109, a communication commanding unit 110, and a diagnostic unit 111. Further, the diagnostic unit 111 includes a power fault diagnosis part 111a, an earth fault diagnosis part 111b, and a disconnection diagnosis part 111c.

The PWM generating unit 107 generates an ON/OFF command signal to the drive circuit 108 in accordance with a Duty ratio output from the Duty operation unit 109. The drive circuit 108 opens/closes an FET (Field Effect Transistor) 112, based on the ON/OFF command signal from the PWM generating unit 107 to drive the electromagnetic load 101. A drain of the FET 112 is connected to a constant voltage source 117 (voltage 2.5V) and the electromagnetic load drive output terminal 104.

The drive circuit 108 is connected to the electromagnetic load drive output terminal 104 and the ground connection terminal 105. The ground connection terminal 105 is connected to ground outside the ECU 103. The drive circuit 108 includes a timer 113 for current, a timer 114 for voltage, a mask determination unit 115, a comparator 116, the above-described constant voltage source 117, a voltmeter 118, an ammeter 119, and a register 120.

The constant voltage source 117 is connected to the electromagnetic load drive output terminal 104 and the drain of the FET 112. The voltmeter 118 is disposed between the electromagnetic load drive output terminal 104 and the FET 112 and between the ground connection terminal 105 and the FET 112. The ammeter 119 is disposed between the ground connection terminal 105 and a source of the FET 112.

The comparator 116 includes a power fault comparator 116a, an earth fault comparator 116b, and a disconnection comparator 116c, and generates comparator signals, based on values of the voltmeter 118 and the ammeter 119.

The mask determination unit 115 includes a current mask determination part 115a and a voltage mask determination part 115b, and generates comparison mask signals on the basis of the ON/OFF command signal from the PWM generating unit 107, the comparator signals from the comparator 116, a timer value from the timer 113 for current, and a timer value from the timer 114 for voltage.

The timer 113 for current is used in the current mask determination part 115a, and the timer 114 for voltage is used in the voltage mask determination part 115b. They respectively output ON signals when a predetermined time has elapsed.

The register 120 stores therein a current mask register value 120a, a power fault comparator register value 120b, a voltage mask register value 120c, an earth fault comparator register value 120d, and a disconnection comparator register value 120e. The register 120 generates a mask register value and a comparator register value on the basis of the comparison mask signal from the mask determination unit 115 and the comparator signal from the comparator 116.

The communication commanding unit 110 generates a communication permission signal for the operation processing device 106 and the drive circuit 108. The diagnostic unit 111 acquires the mask register value (120a, 120c) and the comparator register value (120b, 120d, 120e) from the register 120 during a period from a time when the communication permission signal of the communication commanding unit 110 becomes OK to a time when the communication permission signal becomes NG.

Here, the electronic control unit 103 of the first embodiment includes the drive circuit 108 and the operation processing device 106 which transmits the ON/OFF command signal to the drive circuit 108. The drive circuit 108 includes a measurement unit which measures a voltage at the end of the electromagnetic load 101 or a current of the electromagnetic load 101, and a storage unit for acquiring by the operation processing device 106, information for separating a state in which an abnormality is not generated, and a state (diagnostic indeterminate state) in which an abnormality cannot be diagnosed, on the basis of the output of the measurement unit. The measurement unit includes the voltmeter 118 and the ammeter 119. The storage unit includes the register 120.

Thus, the operation processing device 106 is capable of identifying OK of disconnection, an earth fault, and a power fault.

Here, the electronic control unit 103 of the first embodiment includes the drive circuit 108 and the operation processing device 106 which transmits the ON/OFF command signal to the drive circuit 108. The drive circuit 108 includes the FET 112 (switching part) which switches the electromagnetic load 102 having one end connected to the power supply 102 or the ground, based on the ON/OFF command signal, and the storage unit which causes the operation processing device 106 to acquire, on the basis of the output of the voltmeter 118 or the ammeter 119, abnormality occurrence information indicative of the occurrence of at least one of disconnection, an earth fault, and a power fault of a path from the FET 112 to the electromagnetic load 101, and information (information (reset information) in Step 504 of FIG. 5) for separating (distinguishing) between a state in which no abnormality is generated and a state (indeterminate state) in which the abnormality cannot be diagnosed.

Thus, the operation processing device 106 is capable of receiving the information for performing the above distinction to identify NG, OK and indetermination of the disconnection, the earth fault and the power fault and thereby perform abnormality diagnosis.

Here, in the electronic control unit 103 of the first embodiment, the drive circuit 108 includes the constant voltage source 117 which is disposed between the electromagnetic load 101 and the FET 112 and applies a constant voltage as for disconnection detection.

Consequently, the drive circuit 108 is capable of detecting disconnection in a path from the electromagnetic load drive output terminal 104 to the power supply 102 from the ON/OFF command signal from the PWM generating unit 107 and the value of the voltmeter 118.

Next, the feature of the first embodiment will be described using FIGS. 2 to 8.

Figure 2:
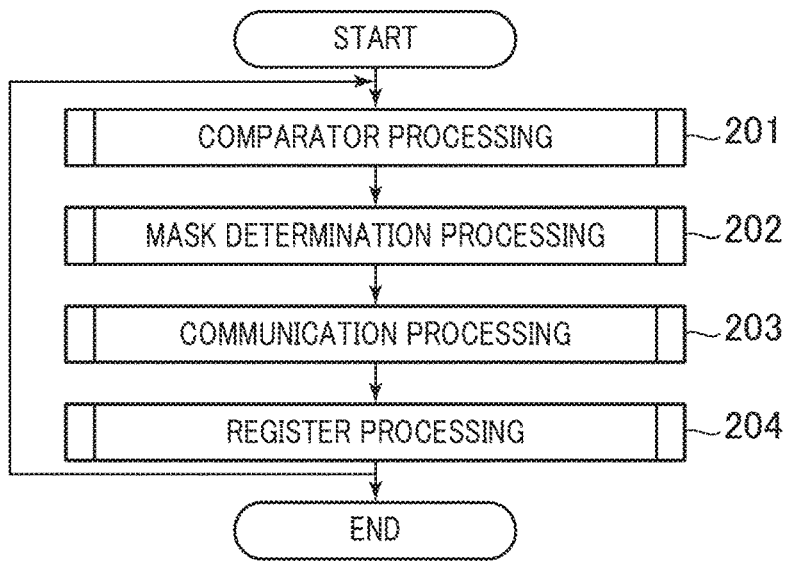
FIG. 2 is a flowchart in a drive circuit according to the first embodiment of the present invention.

FIG. 2 is a diagram showing an example of a flowchart in the drive circuit 108 according to the first embodiment of the present invention.

First, in FIG. 2, the flow of Steps 201 to 204 will be described. Step 201 is comparator processing of the measurement values of the voltmeter 118 and the ammeter 119 in the mask determination unit 115 and generates comparator signals in accordance with FIG. 3 to be described later.

Step 202 is mask determination processing in the comparator 116 and generates mask signals in accordance with FIG. 4 to be described later. The mask signal is a signal indicative of whether or not to perform abnormality diagnosis.

Step 203 is communication processing in the register 120 and receives a communication permission signal generated in the communication commanding unit 110.

Step 204 is register processing in the register 120 and generates mask register values and comparator register values in accordance with FIG. 5 to be described later.

Figure 3:
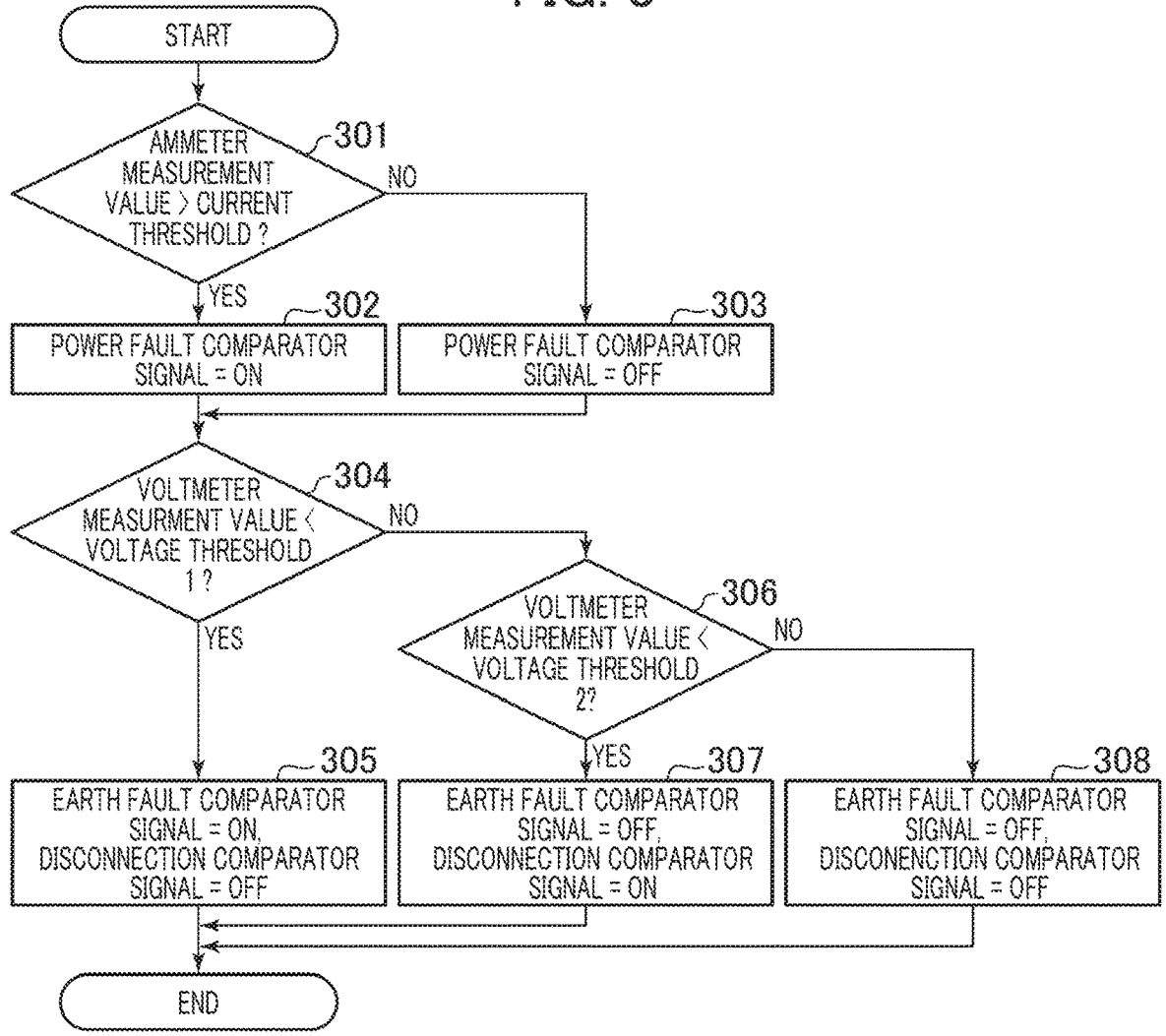
FIG. 3 is a flowchart in Step 201 shown in FIG. 2 where a circuit of FIG. 1 is applied.

FIG. 3 is a diagram showing an example of a flowchart in Step 201 shown in FIG. 2 where the circuit of FIG. 1 is applied.

In FIG. 3, in Step 301, whether an ammeter measurement value is larger than a current threshold is determined in the power fault comparator 116*a*. When the answer is Yes (the ammeter measurement value is larger than the current threshold) in Step 301, the processing advances to Step 302, where a power fault comparator signal is set to ON, and the processing advances to Step 304. When the answer is No (the ammeter measurement value is not greater than the current threshold) in Step 301, the processing advances to Step 303, where the power fault comparator signal is set to OFF, and the processing advances to Step 304.

In Step 304, the earth fault comparator 116*b* determines whether a voltmeter measurement value is smaller than a voltage threshold 1. When the answer is Yes (the voltmeter measurement value is smaller than the voltage threshold 1) in Step 304, the processing advances to Step 305, where an earth fault comparator signal is set to ON and a disconnection comparator signal is set to OFF, and the processing is ended.

When the answer is No (the voltmeter measurement value is equal to or greater than the voltage threshold 1) in Step 304, the processing advances to processing of Step 306.

In Step 306, the disconnection comparator 116*c* determines whether the voltmeter measurement value is smaller than a voltage threshold 2. When the answer is Yes (the voltmeter measurement value is smaller than the voltage threshold 2) in Step 306, the processing advances to Step 307, where the earth fault comparator signal is set to OFF and the disconnection comparator signal is set to ON, and the processing is ended. When the answer is No (the voltmeter measurement value is equal to or greater than the voltage threshold 2) in Step 306, the processing advances to Step 308, where the earth fault comparator signal is set to OFF and the disconnection comparator signal is set to OFF, and the processing is ended.

Figure 4:
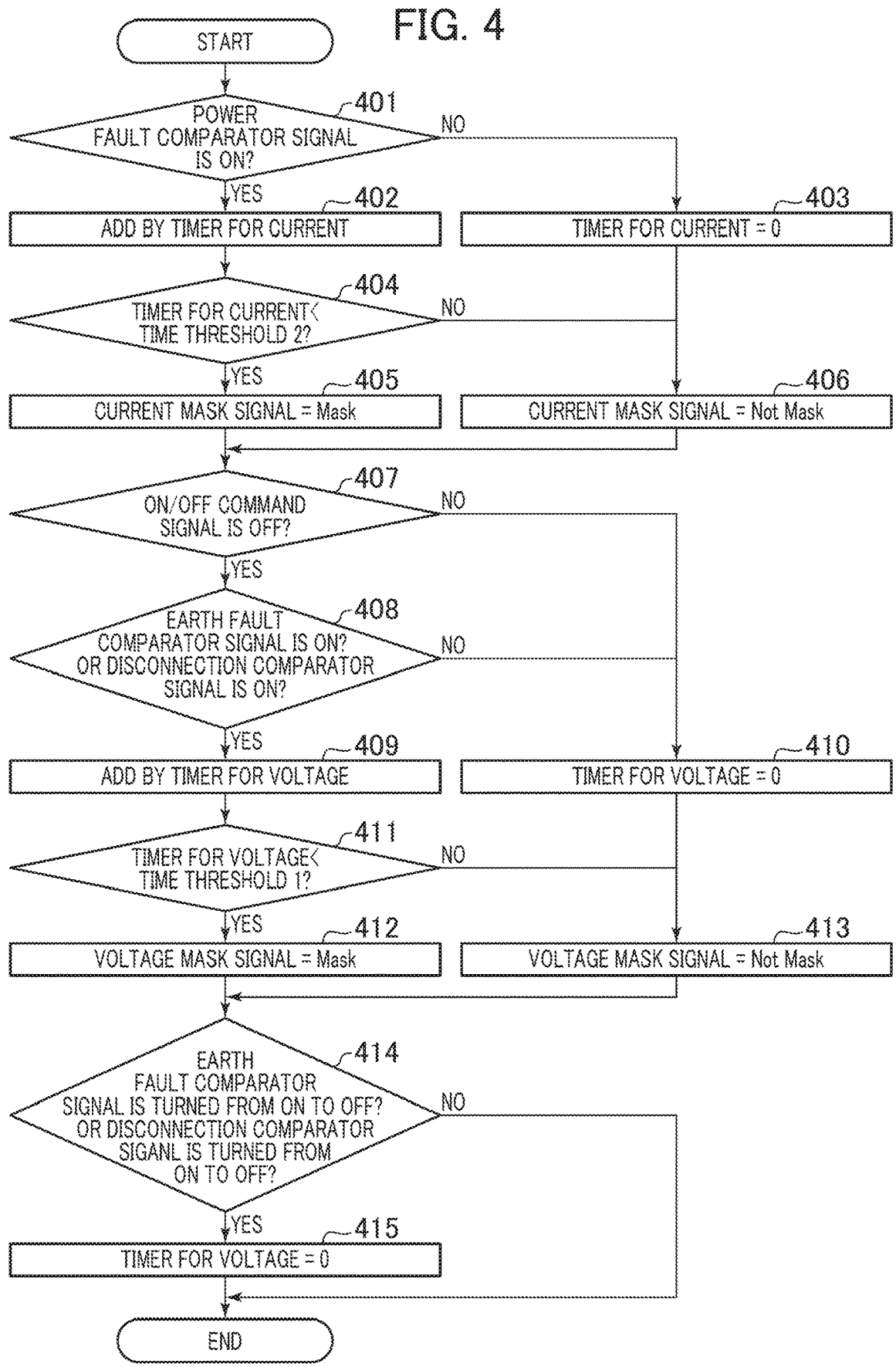
FIG. 4 is a flowchart of mask processing in Step 202 of FIG. 2 where the circuit shown in FIG. 1 is applied.

FIG. 4 is a diagram showing an example of a flowchart of mask processing in Step 202 of FIG. 2 where the circuit shown in FIG. 1 is applied.

In FIG. 4, it is determined in Step 401 whether the power fault comparator signal is ON. When the answer is Yes (the power fault comparator signal is ON) in Step 401, the processing advances to Step 402, where the timer 113 for current adds a time, and the processing advances to Step 404.

When the answer is No (the power fault comparator signal is OFF) in Step 401, the processing advances to Step 403, where the timer 113 for current is set to 0, and the processing advances to processing of Step 406.

In Step 404, the current mask determination part 115*a* determines whether a timer value of the timer 113 for current is smaller than a time threshold 2. When the answer is Yes (the timer value of the timer 113 for the current is smaller than the time threshold 2) in Step 404, the processing advances to Step 405, where a current mask signal is set to Mask (the mask processing is performed). That is, the mask processing (mask signal) indicates that the diagnosis is not performed when the output of the measurement unit is unstable. When the answer is No (the timer value of the timer 113 for current is equal to or greater than the time threshold 2) in Step 404, the processing advances to Step 406, where the current mask signal is set to Not Mask (the mask processing is not performed). After execution of the processing of Step 405 and Step 406, the processing advances to processing of Step 407.

It is determined in Step 407 whether an ON/OFF command signal from the PWM generating unit 107 is OFF. When the answer is Yes (the ON/OFF command signal is OFF) in Step 407, the processing advances to processing of Step 408. When the answer is No (the ON/OFF command signal is not OFF) in Step 407, the processing advances to processing of Step 410.

It is determined in Step 408 whether an earth fault comparator signal is ON or a disconnection comparator signal is ON. When the answer is Yes (the earth fault comparator signal is ON or the disconnection comparator signal is ON) in Step 408, the processing advances to Step 409, where a timer value of the timer 114 for voltage is added, and the processing advances to processing of Step 411. When the answer is No (the earth fault comparator signal and the disconnection comparator signal are both OFF) in Step 408, the processing advances to Step 410, where the timer 114 for voltage is set to 0, and the processing advances to processing of Step 413.

In Step 411, the voltage mask determination part 115*b* determines whether the timer value of the timer 113 for voltage is less than a time threshold 1. When the answer is Yes (the timer value of the timer 113 for voltage is less than the time threshold 1) in Step 411, the processing advances to Step 412, where a voltage mask signal is set to Mask. That is, the mask processing (mask signal) indicates that the diagnosis is not performed when the output of the measurement unit is unstable. When the answer is No (the timer value of the timer 113 for voltage is equal to or greater than the time threshold 1) in Step 411, the processing advances to Step 413, where the voltage mask signal is set to Not Mask. After execution of Step 412 and Step 413, the processing advances to processing of Step 414.

It is determined in Step 414 whether the earth fault comparator signal is turned from ON to OFF or the disconnection comparator signal is turned from ON to OFF. When the answer is Yes (the earth fault comparator signal is turned from ON to OFF or the disconnection comparator signal is turned from ON to OFF) in Step 414, the processing advances to Step 415, where the timer value of the timer 114 for voltage is set to 0, and the processing is ended. When the answer is No (the earth fault comparator signal is not turned from ON to OFF, and the disconnection comparator signal is not turned from ON to OFF) in Step 414, the processing is ended without doing anything.

Next, a method of setting the voltage threshold 1, the voltage threshold 2, the current threshold, the time threshold 1, and the time threshold 2 used when generating the comparator signals and current and voltage mask signals of the disconnection, the earth fault, and the power fault will be described with reference to FIG. 3 and FIG. 4.

When the FET 112 is ON, both ends of the voltmeter 118 become equipotential, and hence, a detected voltage value of the voltmeter 118 becomes 0[V] regardless of the normality and abnormality. Thus, it is not possible to identify the abnormality by using the voltmeter 118 in the state in which the FET 112 is ON.

On the other hand, when the FET 112 is OFF, the value measured by the voltmeter 118 becomes 14[V] at a normal time because of being a difference in potential between the electromagnetic load drive output terminal 104 (14[V] because of being connected to the power supply 102) and the ground connection terminal 105 (0[V] because of being connected to ground).

When the electromagnetic load drive output terminal 104 is subjected to the ground fault, the value measured by the voltmeter 118 becomes 0[V] because of being a difference in potential between the electromagnetic load drive output terminal 104 (0[V] because of grounding) and the ground connection terminal 105 (0[V] because of being connected to ground).

When the electromagnetic load drive output terminal 104 is disconnected, the value becomes 2.5[V] because of being a difference in potential between the electromagnetic load drive output terminal 104 (the constant voltage source 117=2.5[V] because of disconnection) and the ground connection terminal 105 (0[V] because of being connected to ground).

When the electromagnetic load drive output terminal 104 is subjected to the power fault, the value becomes 14[V] because of being a difference in potential between the electromagnetic load drive output terminal 104 (the power supply 102=14[V] because of the power fault) and the ground connection terminal 105 (0[V] because of being connected to ground).

Thus, in the case of both the normal time and the occurrence of the power fault together, the value of the voltmeter 118 becomes 14[V], and hence only the voltmeter 118 cannot distinguish between the normalization and the power fault.

Now, consider the values of the ammeter 119 at the normal time and the power fault time where the FET 112 is ON. At the normal time, a current of a resistance value of the electromagnetic load 101÷(the power supply 102=14[V]) flows. On the other hand, at the power fault, since the path from the electromagnetic load drive output terminal 104 to the ground becomes a state in which the resistance is almost absent, an overcurrent flows therethrough.

Further, since the reliability of the voltage value to be measured is required when the value of the voltmeter 118 is used for disconnection/earth fault detection, it is necessary to set the time taken until the voltage value becomes stable after a change in the voltage, by the time threshold 1. It is not possible to perform the disconnection/earth fault detection until the time threshold 1 elapses after the change in voltage. Even when the value of the ammeter 119 is used for power fault detection, reliability is required as with the voltage. It is therefore necessary to set the time taken until the value after a change in current becomes stable, by the time threshold 2. The power fault detection cannot be performed until the time threshold 2 elapses after the change in current.

From the above results, the voltage threshold 1 to detect the earth fault, the voltage threshold 2 to detect the disconnection, and the current threshold to detect the power fault are set like, for example, the following equations (1) to (3).

$$\text{Voltage threshold 1} = \text{constant voltage source 117}(2.5[V]) \div 2 \quad (1)$$

$$\text{Voltage threshold 2} = (\text{power supply 102}(14[V]) + \text{constant voltage source 117}(2.5[V])) \div 2 \quad (2)$$

$$\text{Current threshold} = (\text{power supply 102}(14[V]) \div \text{electromagnetic load 101 resistance value}) \times 2 \quad (3)$$

Further, the time threshold 1 and the time threshold 2 respectively set a sufficient stable time from the voltage/current changes in consideration of circuit characteristics.

Here, in the electronic control unit 103 of the first embodiment, the information for separating the state in which the abnormality is not generated, and the state in which the abnormality cannot be diagnosed is mask processing information in which no diagnosis is performed in a predetermined state.

Thus, an erroneous detection can be prevented without performing diagnosis in the situation in which the disconnection, the earth fault, and the power fault cannot be identified correctly.

Here, in the electronic control unit 103 of the first embodiment, the mask processing is processing in which the diagnosis is not performed when the ON/OFF command signal from the PWM generating unit 10 is in the predetermined state and when the outputs of the voltmeter 118 and the ammeter 119 are unstable.

Thus, it is possible to prevent erroneous detection of the disconnection, the earth fault, and the power fault where the voltage and the current are unstable.

Here, in the electronic control unit 103 of the first embodiment, the electromagnetic load 101 has one end connected to the power supply 102. The register 120 performs mask processing in which the information of the occurrence of the power fault of the path from the FET 112 to the electromagnetic load 101 is diagnosed based on the current output of the ammeter 119, and in which the diagnosis is not performed when the current output of the ammeter 119 is unstable.

Thus, in the configuration of the low side driving system shown in FIG. 1, NG of the power fault can be detected.

Here, in the electronic control unit 103 of the first embodiment, the electromagnetic load 101 has one end connected to the power supply 102, and the register 120 performs mask processing in which when the ON/OFF command signal from the PWM generating unit 10 is OFF, information of the occurrence of at least one of the disconnection and earth fault of the path from the FET 112 to the electromagnetic load 101 is diagnosed based on the voltage output of the voltmeter 118, and the diagnosis is not performed when the ON/OFF command signal is ON, and the voltage output of the voltmeter 118 is unstable.

Thus, in the configuration of the low side driving system shown in FIG. 1, NG of the disconnection and earth fault can be detected.

Figure 5:
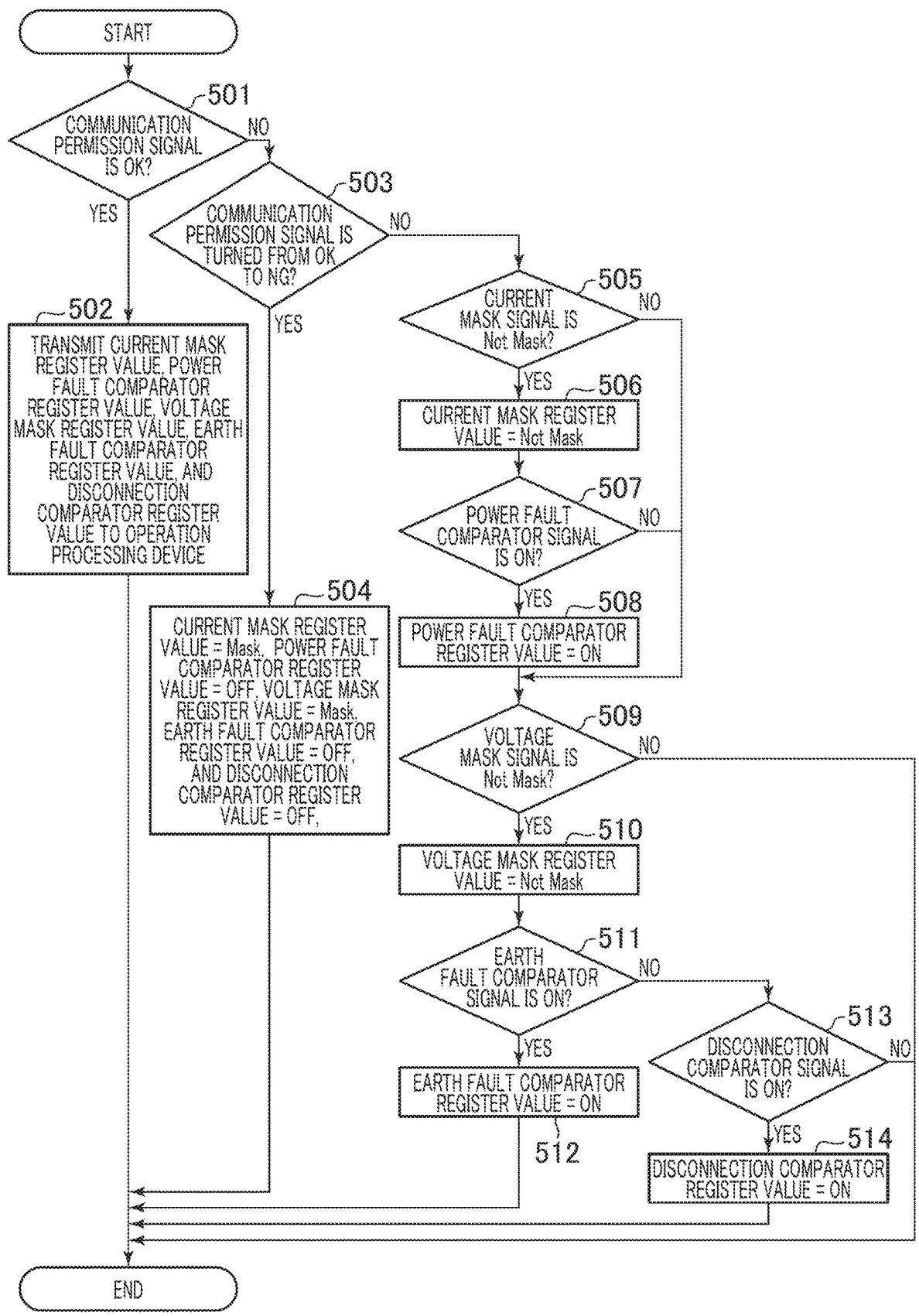
FIG. 5 is a flowchart in Step 204 of FIG. 2 where the circuit having the configuration shown in FIG. 1 is applied.

FIG. 5 is a diagram showing an example of a flowchart in Step 204 (register processing) of FIG. 2 where the circuit having the configuration shown in FIG. 1 is applied.

In FIG. 5, in Step 501, the register 120 determines whether "the communication permission signal is OK" is correct. When the answer is Yes ("the communication permission signal is OK" is correct) in Step 501, the processing advances to Step 502, where the current mask register value 120*a*, the power fault comparator register value 120*b*, the voltage mask register value 120*c*, the earth fault comparator register value 120*d*, and the disconnection comparator register value 120*e* are transmitted to the operation processing device 106, and the processing is ended.

When the answer is No ("the communication permission signal is OK" is not correct) in Step 501, the processing advances to processing of Step 503.

It is determined in Step 503 whether "the communication permission signal is turned from OK to NG" is correct. When the answer is Yes ("the communication permission signal is turned from OK to NG" is correct) in Step 503, the processing advances to Step 504, where the current mask register value 120*a* is set to Mask (mask), the power fault comparator register value 120*b* is set to OFF (mask off), the voltage mask register value 120*c* is set to Mask (mask), the earth fault comparator register value 120*d* is set to OFF (mask off), and the disconnection comparator register value 120*e* is set to OFF (mask off). When the answer is No ("the communication permission signal is turned from OK to NG" is not correct) in Step 503, the processing advances to processing of Step 505.

It is determined in Step 505 whether "the current mask signal is Not Mask" is correct. When the answer is Yes ("the current mask signal is Not Mask" is correct) in Step 505, the processing advances to Step 506, where the current mask register value 120*a* is set to Not Mask (unmasked), and the processing advances to processing of Step 507. When the answer is No ("the current mask signal is Not Mask" is not correct) in Step 505, the processing advances to processing of Step 509.

It is determined in Step 507 whether "the power fault comparator signal is ON" is correct. When the answer is Yes ("the power fault comparator signal is ON" is correct) in Step 507, the processing advances to Step 508, where the power fault comparator register value 120*b* is set to ON. When the answer is No (the power fault comparator signal is ON" is not correct) in Step 507, and after processing of Step 508, the processing advances to processing of Step 509.

It is determined in Step 509 whether "the voltage mask signal is Not Mask" is correct. When the answer is Yes ("the voltage mask signal is Not Mask" is correct) in Step 509, the processing advances to Step 510, where the voltage mask register value 120*c* is set to Not Mask, and the processing advances to processing of Step 511. When the answer is No ("the voltage mask signal is Not Mask" is not correct) in Step 509, nothing is done (the processing is ended).

It is determined in Step 511 whether "the earth fault comparator signal is ON" is correct. When the answer is Yes ("the earth fault comparator signal is ON" is correct) in Step 511, the processing advances to Step 512, where the earth fault comparator register value 120*d* is set to ON. When the answer is No ("the earth fault comparator signal is ON" is not correct) in Step 509, the processing advances to processing of Step 513.

It is determined in Step 513 whether "the disconnection comparator signal is ON" is correct. When the answer is Yes ("the disconnection comparator signal is ON" is correct) in Step 513, the processing advances to Step 514, where the disconnection comparator register value 120*e* is set to ON. When the answer is No ("the disconnection comparator signal is ON" is not correct) in Step 513, the processing is ended without doing anything.

Here, in the electronic control unit 103 of the first embodiment, in order to separate the information of abnormality occurrence, the information in which no abnormality is generated, and the information indicative of the state in which the abnormality cannot be diagnosed, the information stored in the register 120 is cleared when the operation processing device 106 and the drive circuit communicate with each other.

That is, in the prior art, since the driving period of the operation processing device 106 is slower than the driving period of the drive circuit 108, the power fault, the earth fault, and the disconnection are diagnosed. Even if results of the diagnosis are stored in the register 120, the drive circuit 108 may raise the Mask signal (mask signal) before the operation processing device 106 communicates with the drive circuit 108, Thereafter, when the operation processing device 106 communicates with the drive circuit 108, the mask signal is in a mask state, and hence, the opportunity of the diagnosis has been determined to have been absent.

On the other hand, in the first embodiment of the present invention, when the diagnosis opportunity is present, the mask signal maintains the state of Not Mask even if the mask signal is subsequently brought into the mask state. When the operation processing device 106 requests the drive circuit 108 for communication therewith, the mask signal is set to a state of Mask, and the information stored in the register 120 is cleared. Consequently, the operation processing device 106 is capable of recognizing the presence of the opportunity of diagnosis and utilizing diagnosis information obtained at that time.

Further, when the mask signal is in the state of Mask when the operation processing device 106 performs communication with the drive circuit 108, the operation processing device 106 is capable of recognizing the absence of the opportunity of the diagnosis, i.e., the presence of the indeterminate state.

Thus, the operation processing device 106 is capable of storing the presence of the opportunities of diagnosing the disconnection, the earth fault, and the power fault between communications with the drive circuit 108, and accurately identifying three states.

Figure 6:
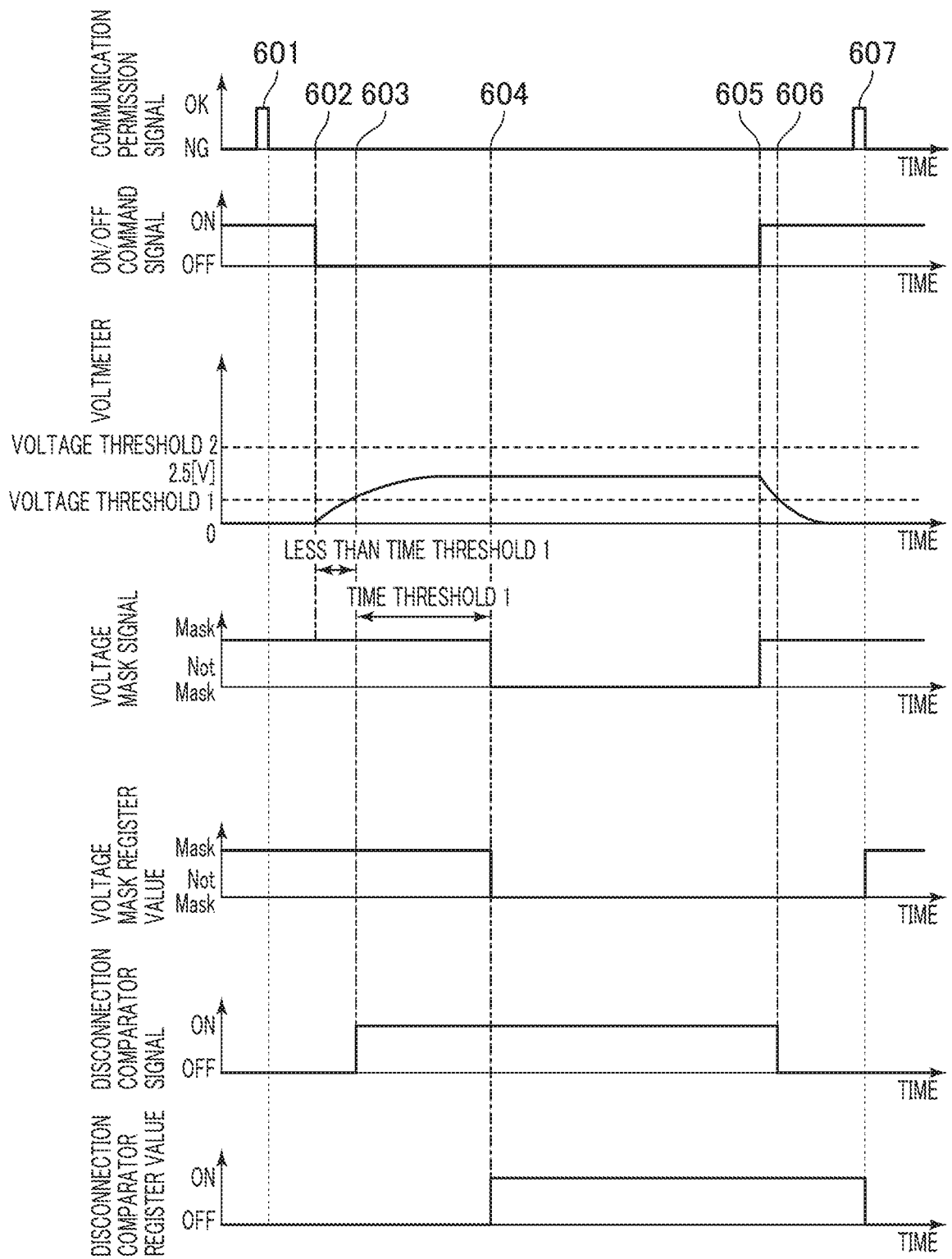
FIG. 6 is a timing chart in which a register generates a disconnection comparator register value and a voltage mask register value in the drive circuit, at the occurrence of disconnection.

FIG. 6 is a diagram showing an example of a timing chart in which the register 120 generates the disconnection comparator register value 120e and the voltage mask register value 120c in the drive circuit 108, at the occurrence of disconnection.

In FIG. 6, a time 601 is a time at which the communication permission signal is first turned from OK to NG. The disconnection comparator register value 120e is OFF, and the voltage mask register value 120c is also Mask.

A time 602 is a time at which the ON/OFF command signal is turned from ON to OFF, and the value of the voltmeter 118 starts to increase. Since the voltage value of the voltmeter 118 is less than the voltage threshold 1 at time 602, the timer 114 for voltage starts counting until the voltage value reaches the time threshold 1.

A time 603 is a time at which the value of the voltmeter 118 becomes greater than or equal to the voltage threshold 1 and less than the voltage threshold 2, and the disconnection comparator signal becomes ON. Then, the count is reset once until the value reaches the time threshold 1 of the timer 114 for voltage, and the count is started again.

A time 604 is a time at which only the time threshold 1 elapses from the time 603, and the voltage mask signal and the voltage mask register value 120c reach Not Mask. Then, the disconnection comparator register value 120e becomes ON to satisfy "the disconnection comparator signal is ON and the voltage mask signal is Not Mask".

A time 605 is a time at which the ON/OFF command signal becomes ON, and the value of the measurement value of the voltmeter 118 starts to decrease. At the same time, the voltage mask signal is turned from Not Mask to Mask.

A time 606 is a time at which the value of the measurement value of the voltmeter 118 falls below the voltage threshold 1, and the disconnection comparator signal becomes OFF.

A time 607 is a time at which the communication permission signal is turned from NG to OK at the second time in FIG. 6. The voltage mask signal register value is turned from Not Mask to Mask, and the disconnection comparator register value becomes OFF. Here, the timing relation among the communication permission signal, and the voltage mask register value, the disconnection comparator signal and the disconnection comparator register value has been described in FIG. 6, but the timing relation among the communication permission signal, and the voltage mask register value, the earth fault comparator signal and the earth fault comparator register value also becomes similar to FIG. 6. Further, the timing relation among the communication permission signal and the power fault comparator signal and the power fault comparator register value also becomes similar to FIG. 6, but the voltage mask signal of FIG. 6 is a current mask signal, and the voltage mask register value becomes a current mask register value.

Figure 7:
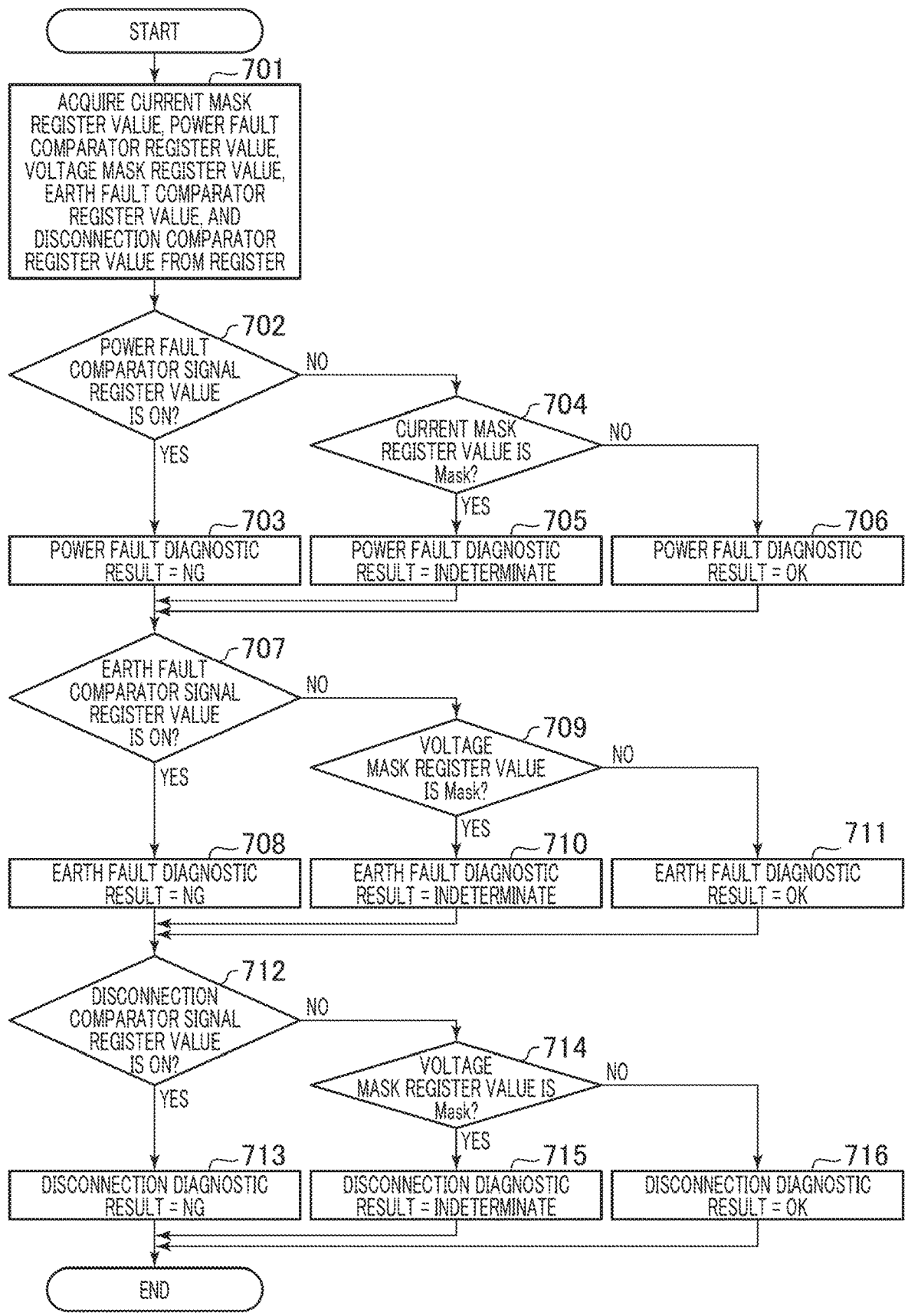
FIG. 7 is an operation flowchart in an operation processing device where the circuit of the electronic control unit shown in FIG. 1 is applied.

FIG. 7 shows an example of an operation flowchart in the operation processing device 106 where the circuit of the electronic control unit 103 shown in FIG. 1 is applied.

In FIG. 7, in Step 701, the operation processing device 106 acquires the current mask register value 120a, the power fault comparator register value 120b, the voltage mask register value 120c, the earth fault comparator register value 120d, and the disconnection comparator register value 120e from the register 120, and proceeds to Step 702.

Processing of Steps 702 to 706 are executed in the power fault diagnosis part 111a.

In Step 702, a determination is made as to whether or not "the power fault comparator signal register value is ON" is correct. When the answer is Yes ("the power fault comparator signal register value is ON" is correct) in Step 702, the operation processing device proceeds to Step 703 to set a power fault diagnostic result to be NG, and proceeds to processing of Step 707. When the answer is No ("the power fault comparator signal register value is ON" is not correct) in Step 702, the operation processing device proceeds to the processing of Step 704.

It is determined in Step 704 whether "the current mask register value is Mask" is correct. When the answer is Yes ("the current mask register value is Mask" is correct) in Step 704, the operation processing device proceeds to Step 705 to set a power fault diagnostic result to be indeterminate. When the answer is No ("the current mask register value is Mask" is not correct) in Step 704, the operation processing device proceeds to Step 706 to set the power fault diagnostic result to be OK. After the processing of Step 705 and Step 706, the operation processing device proceeds to the processing of Step 707.

The processing of Steps 707 to 711 are executed in the earth fault diagnosis part 111b.

It is determined in Step 707 whether "the earth fault comparator signal register value is ON" is correct. When the answer is Yes ("the earth fault comparator signal register value is ON" is correct) in Step 707, the operation processing device proceeds to Step 708 to set an earth fault diagnostic result to be NG, and proceeds to processing of Step 712. When the answer is No ("the earth fault comparator signal register value is ON" is not correct) in Step 707, the operation processing device proceeds to the processing of Step 709.

It is determined in Step 709 whether "the voltage mask register value is Mask" is correct. When the answer is Yes ("the voltage mask register value is Mask" is correct) in Step 709, the operation processing device proceeds to Step 710 to set an earth fault diagnostic result to be indeterminate. When the answer is No ("the voltage mask register value is Mask" is not correct) in Step 709, the operation processing device proceeds to Step 711 to set an earth fault diagnostic result to be OK. After the processing of Step 710 and Step 711, the operation processing device proceeds to the processing of Step 712.

The processing of Steps 712 to 716 are executed in the disconnection diagnosis part 111c.

It is determined in Step 712 whether "the disconnection comparator signal register value is ON" is correct. When the answer is Yes ("the disconnection comparator signal register value is ON" is correct) in Step 712, the operation processing device proceeds to Step 713 to set a disconnection diagnostic result to be NG, and the processing is ended.

When the answer is No ("the disconnection comparator signal register value is ON" is not correct) in Step 712, the operation processing device proceeds to the processing of Step 714. It is determined in Step 714 whether "the voltage mask register value is Mask" is correct. When the answer is Yes ("the voltage mask register value is Mask" is correct) in Step 714, the operation processing device proceeds to Step 715 to set a disconnection diagnostic result to be indeterminate, and the processing is ended. When the answer is No ("the voltage mask register value is Mask" is not correct) in Step 714, the operation processing device proceeds to Step 716 to set a disconnection diagnostic result to be OK, and the processing is ended.

Here, in the electronic control unit 103 of the first embodiment, as in the flowchart shown in FIG. 7, the operation processing device 106 determines the respective diagnostic results to be NG where the respective comparator register values are ON, determines the respective diagnostic results to be OK where the respective comparator register values are OFF and the respective mask register values are Not Mask, and determines the results to be indeterminate where the respective comparator register values are OFF and the respective mask register values are Mask. That is, when the abnormality occurrence information indicates the occurrence of an abnormality, the operation processing device 106 determines that the abnormality has occurred. When the abnormality occurrence information does not indicate the abnormality occurrence, and the mask signal indicates the execution of abnormality diagnosis, the operation processing device 106 determines that the abnormality has not been generated. When the abnormality occurrence information does not indicate the abnormality occurrence, and the mask signal indicates that the abnormality diagnosis is not performed, the operation processing device 106 determines the diagnosis to be the indeterminate state.

Thus, the operation processing device 106 is capable of identifying the three states of the disconnection, the earth fault, and the power fault by using the comparator register values and the mask register values.

Further, in the above configuration, the drive circuit 108 has a drive circuit diagnosis function of diagnosing the abnormality of the drive circuit 108. When the drive circuit self-diagnosis function indicates an abnormality, the operation processing device 106 may determine a diagnostic result to be indeterminate.

According to the above configuration, when there is a risk that the abnormality occurs in the drive circuit 108, and the operation processing device 106 misdiagnoses the three states, the operation processing device 106 is capable of identifying that the disconnection, the earth fault, and the power fault of the electromagnetic load 101 are indeterminate.

Further, in the above configuration, the operation processing device 106 has an operation processing device diagnosis function of diagnosing the abnormality of the operation processing device 106. When the operation processing device self-diagnosis function indicates an abnormality, the operation processing device 106 may determine a diagnostic result to be indeterminate.

According to the above configuration, when there is a risk that the abnormality occurs in the operation processing device 106, and the operation processing device 106 misdiagnoses the three states, the operation processing device 106 is capable of identifying that the disconnection, the earth fault, and the power fault of the electromagnetic load 101 are indeterminate.

Further, in the above configuration, the power supply 102 has a power supply diagnosis function of diagnosing the abnormality of the power supply 102. When the power supply self-diagnosis function indicates an abnormality, the operation processing device 106 may determine a diagnostic result to be indeterminate.

According to the above configuration, when there is a risk that the abnormality occurs in the power supply 102, and the operation processing device 106 misdiagnoses the three states, the operation processing device 106 is capable of identifying that the disconnection, the earth fault, and the power fault of the electromagnetic load 101 are indeterminate.

Further, in the above configuration, the register 120 may be configured to identify the three states of the power fault, the earth fault, and the disconnection based on the flowchart of FIG. 7 and transmit a result of identification thereof to the operation processing device 106.

According to the above configuration, the number of signals to be transmitted to the operation processing device increases more than that of the system of the present embodiment, but a calculation capacity corresponding to the diagnosis processing in the operation processing device 106 can be reduced.

A timing chart of the first embodiment will hereinafter be described using FIG. 8.

Figure 8:
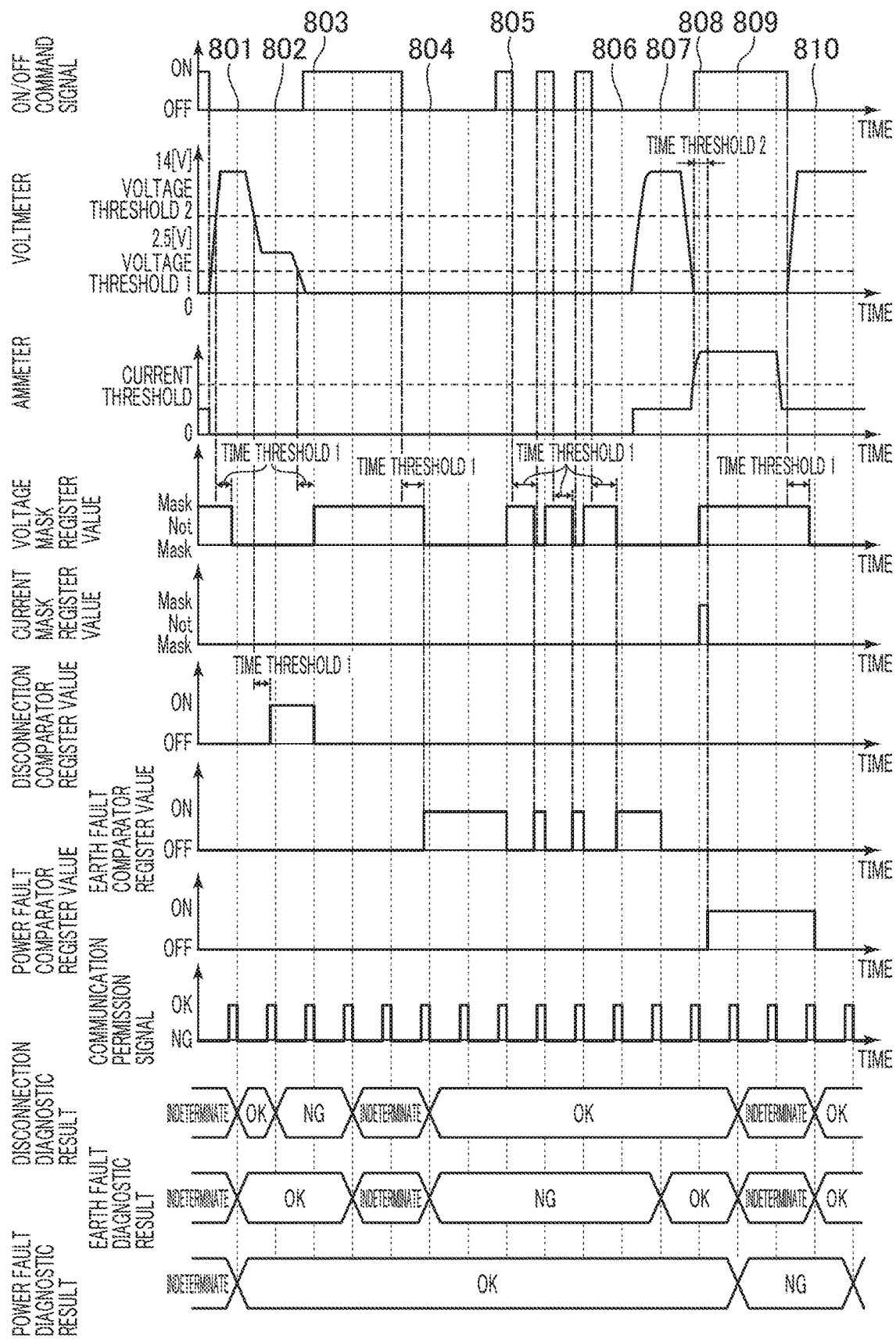
FIG. 8 is a timing chart in which the operation processing device identifies OK, NG, and indetermination where disconnection, an earth fault, and a power fault in the circuit of the electronic control unit shown in FIG. 1 are generated.

FIG. 8 is an example of the timing chart in which the operation processing device 106 identifies OK, NG, and indetermination where disconnection, an earth fault, and a power fault in the circuit of the electronic control unit 103 shown in FIG. 1 are generated.

In FIG. 8, the drive circuit 108 generates comparator register values and mask register values from the ON/OFF command signal, the measurement value of the voltmeter 118, and the measurement value of the ammeter 119 in accordance with the flowchart of FIG. 2. Further, the operation processing device 106 acquires the comparator register values and the mask register values for each communication with the drive circuit 108 and identifies the three states of the disconnection, the earth fault, and the power fault in accordance with the flowchart of FIG. 7.

A time 801 shown in FIG. 8 is a time at which the disconnection, the earth fault, and the power fault are not generated when communication is first performed in the electronic control unit 103. Further, a time 802 is a time at which the disconnection occurs at the time of communication. A time 803 is a time at which the earth fault is generated at the time of communication, but the earth fault cannot be identified yet by the drive circuit 108. A time 804 is a time at which the ON/OFF command signal becomes OFF and hence the earth fault can be identified.

Further, times 805 and 806 are times at which the ON/OFF command signal are is repeatedly turned ON/OFF in a cycle shorter than a communication interval. Times 807 to 810 are times taken until the power fault is generated, and then restoring to a state in which the disconnection, the earth fault, and the power fault are not generated is done.

At the time 801, since the current mask register value 120a is Not Mask, and the power fault comparator register value 120b is OFF, the power fault diagnostic result is OK. Further, since the voltage mask register value 120c is Not Mask, the disconnection comparator register value 120e is OFF, and the earth fault comparator register value 120d is OFF, the disconnection and earth fault diagnostic results of the operation processing device 106 become OK.

At the time 802, the measurement value of the voltmeter 118 is reduced to less than the voltage threshold 2 and equal to or greater than the voltage threshold 1 from the time 801, and the disconnection comparator register value 120e becomes ON. Since the voltage mask register value 120c is Not Mask, the disconnection diagnostic result of the operation processing device 106 becomes NG.

At the time 803, the ON/OFF command signal becomes ON, the voltage mask register value 120c becomes Mask, and the disconnection comparator register value 120e becomes OFF. Thus, the disconnection detection result of the operation processing device 106 becomes NG.

At the time 804, the ON/OFF command signal becomes OFF, the disconnection comparator register value 120*d* becomes ON, and the voltage mask register value 120*c* becomes Not Mask. The earth fault diagnostic result of the operation processing device 106 becomes NG.

At the time 805, the ON/OFF command signal becomes ON, the voltage mask register value 120*c* becomes Mask, and the earth fault comparator register value 120*d* becomes OFF. Then, the ON/OFF command signal is turned OFF soon, and after the time threshold 1 elapses, the voltage mask register value 120*c* becomes Not Mask, and the earth fault comparator register value 120*d* becomes ON. Thereafter, during the period up to the time 806, an operation is repeated in which the ON/OFF command signal makes ON/OFF repeatedly in a cycle shorter than that for communication, and the ON/OFF command signal becomes OFF again and then the time threshold 1 elapses, whereby the earth fault comparator register value 120*d* becomes ON.

At the time 807, the voltage mask register value 120*c* becomes Not Mask, the earth fault comparator register value 120*d* becomes OFF, and hence the earth fault diagnostic result of the operation processing device 106 becomes OK.

At the time 808, the measurement value of the ammeter 119 exceeds the current threshold, but the time threshold 2 does not elapses, and hence, the current mask register value 120*a* becomes Mask, and the power fault comparator register value 120*b* becomes OFF. At this time, the earth fault diagnostic result of the operation processing device 106 becomes OK. Thereafter, the time threshold 2 elapses after the measurement value exceeds the current threshold during the period up to the time 809, and hence the current mask register value 120*a* becomes Not Mask, and the power fault comparator register value 120*b* becomes ON. Thus, the power fault diagnostic result of the operation processing device 106 becomes NG at the time 809.

Since at the time 810, the voltage mask register value 120*c* becomes Not Mask, the disconnection comparator register value 120*e* becomes OFF, and the earth fault comparator register value 120*d* becomes OFF, the disconnection and earth fault diagnostic results of the operation processing device 106 become OK.

According to the first embodiment of the present invention, as described above, when the diagnosis opportunity is present, the mask signal maintains the state of Not Mask even if the mask signal is subsequently brought into the mask state. When the operation processing device 106 requests the drive circuit 108 for communication therewith, the mask signal is set to the state of Mask, and the information stored in the register 120 is transmitted, and then the information stored in the register 120 is cleared. When the mask signal is in the state of Mask when the operation processing device 106 performs communication with the drive circuit 108, the operation processing device 106 is capable of recognizing the absence of the opportunity of diagnosis, i.e., the diagnosis being in the indeterminate state.

Thus, the electronic control unit having the self-diagnosis function (abnormality diagnosis function) can be realized in which the operation processing section is capable of identifying not only the presence or absence of the occurrence of NG of the disconnection, the earth fault, and the power fault (the occurrence and non-occurrence of abnormality), but also the three states of NG, OK, and indetermination.

Second Embodiment

Next, a second embodiment of the present invention will be described using FIGS. 9 to 14.

Figure 9:
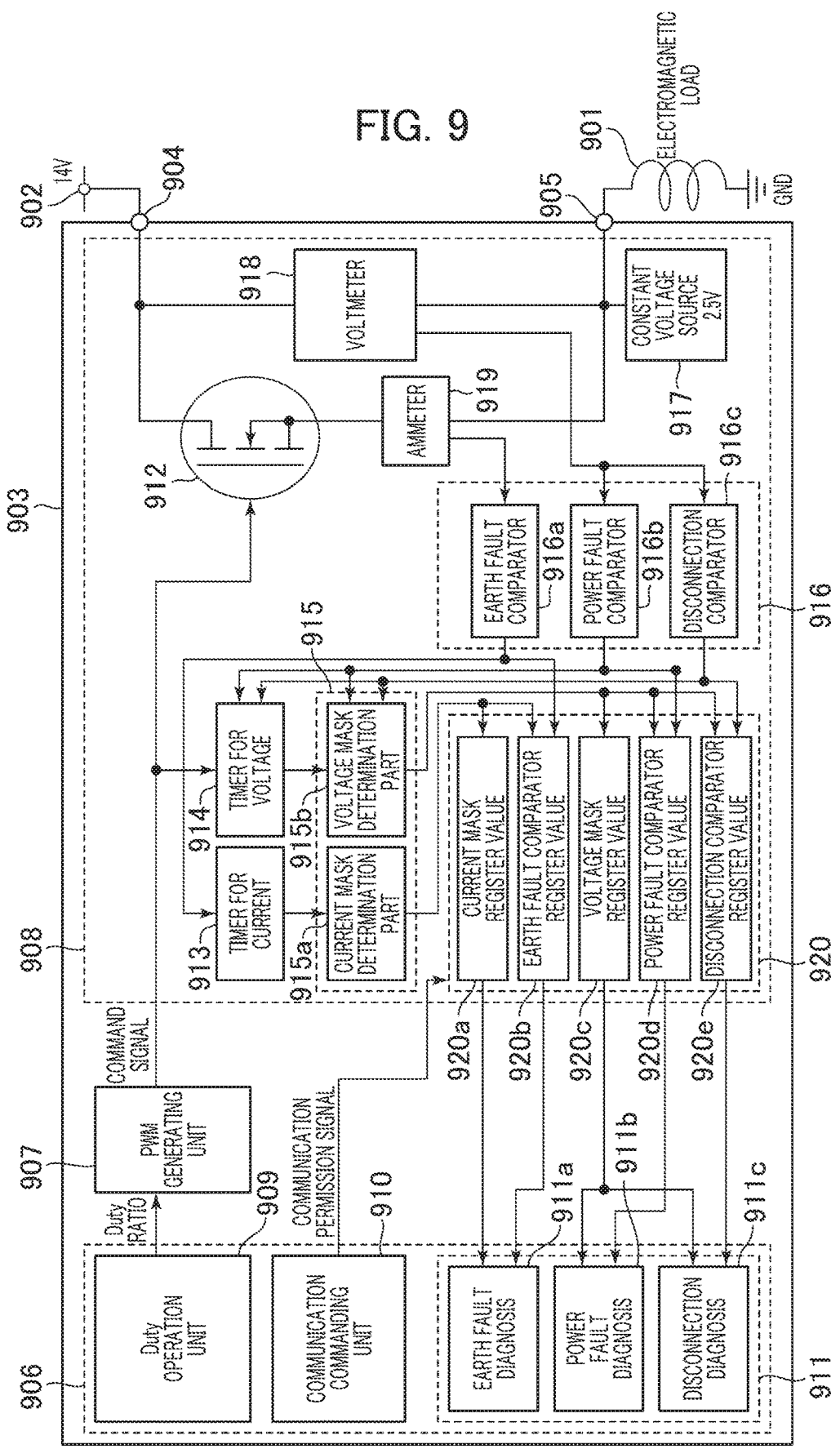
FIG. 9 is an overall configuration diagram of an electronic control unit (applied to a high side driving system) of a second embodiment according to the present invention.

FIG. 9 is an overall configuration diagram of an electronic control unit 903 (applied to a high side driving system) of the second embodiment according to the present invention.

In FIG. 9, one end of an electromagnetic load 901 is connected to ground, and the other end thereof is connected to an electromagnetic load drive output terminal 905 being a terminal for connection with the electronic control unit (ECU) 903. The ECU 903 includes the electromagnetic load drive output terminal 905, a power supply connection terminal 904, an operation processing device 906, a PWM generating unit 907, and a drive circuit 908.

Further, the operation processing device 906 includes a Duty operation unit 909, a communication commanding unit 910, and a diagnostic unit 911. The diagnostic unit 911 includes an earth fault diagnosis part 911*a*, a power fault diagnosis part 911*b*, and a disconnection diagnosis part 911*c*.

The PWM generating unit 907 generates an ON/OFF command signal to the drive circuit 908 in accordance with a Duty ratio output from the Duty operation unit 909. The drive circuit 908 opens/closes an FET (Field Effect Transistor) 912, based on the ON/OFF command signal from the PWM generating unit 907 to drive the electromagnetic load 901.

The drive circuit 908 is connected to the electromagnetic load drive output terminal 905 and the power supply connection terminal 904. The power supply connection terminal 904 is connected to a power supply 902 of 14V outside the ECU 903. The drive circuit 908 includes a timer 913 for current, a timer 914 for voltage, a mask determination unit 915, a comparator 916, a constant voltage source 917 of 2.5V, a voltmeter 918, an ammeter 919, and a register 920. The mask determination unit 915 includes a current mask determination part 915*a* and a voltage mask determination part 915*b*. The register 920 stores therein a current mask register value 920*a*, an earth fault comparator register value 920*b*, a voltage mask register value 920*c*, a power fault comparator register value 920*d*, and a disconnection comparator register value 920*e*.

Further, the comparator 916 includes an earth fault comparator 916*a*, a power fault comparator 916*b*, and a disconnection comparator 916*c*.

The constant voltage source 917 is disposed between the electromagnetic load drive output terminal 905 and the FET 912. The voltmeter 918 is disposed between the electromagnetic load drive output terminal 905 and the FET 912 and between the power supply connection terminal 904 and the FET 912. The ammeter 919 is disposed between the electromagnetic load drive output terminal 905 and the FET 912.

The comparator 916 generates comparator signals, based on values of the voltmeter 918 and the ammeter 919. The mask determination unit 915 generates comparison mask signals on the basis of the ON/OFF command signal, the signals from the comparator 916, a timer value of the timer 913 for current, and a timer value of the timer 914 for voltage.

The timer 913 for current is used in the current mask determination part 915*a*, and the timer 914 for voltage is used in the voltage mask determination part 915*b*. They respectively output ON signals when a predetermined time has elapsed. The register 920 generates a mask register value and a comparator register value on the basis of the above mask signal and comparator signal.

The communication commanding unit 910 generates a communication permission signal for the operation processing device 906 and the drive circuit 908. The diagnostic unit 911 acquires the mask register value and the comparator register value from the register 920 during a period from a time when the communication permission signal becomes OK to a time when the communication permission signal becomes NG.

Hereinafter, the feature of the second embodiment will be described using FIGS. 10 to 14. Incidentally, in the second embodiment, the timing relation among the communication permission signal, the voltage mask signal, the voltage mask register value, the disconnection comparator signal, and the disconnection comparator register value corresponds to the relation shown in FIG. 6. Also, the timing relation among the communication permission signal, the voltage mask signal, the voltage mask register value, the power fault comparator signal, and the power fault comparator register value also becomes equivalent to the relation shown in FIG. 6. Further, in the timing relation among the communication permission signal, the earth fault comparator signal, and the earth fault comparator register value, the current mask signal is used instead of the voltage mask signal, and the current mask register value is used as the voltage mask register value.

First, an example of an operation flowchart of the drive circuit 908 is similar to the flowchart shown in FIG. 2. Then, FIG. 10 shows an example of the flowchart in Step 201 of FIG. 2 where a circuit of the electronic control unit 903 of FIG. 9 is applied.

Figure 10:
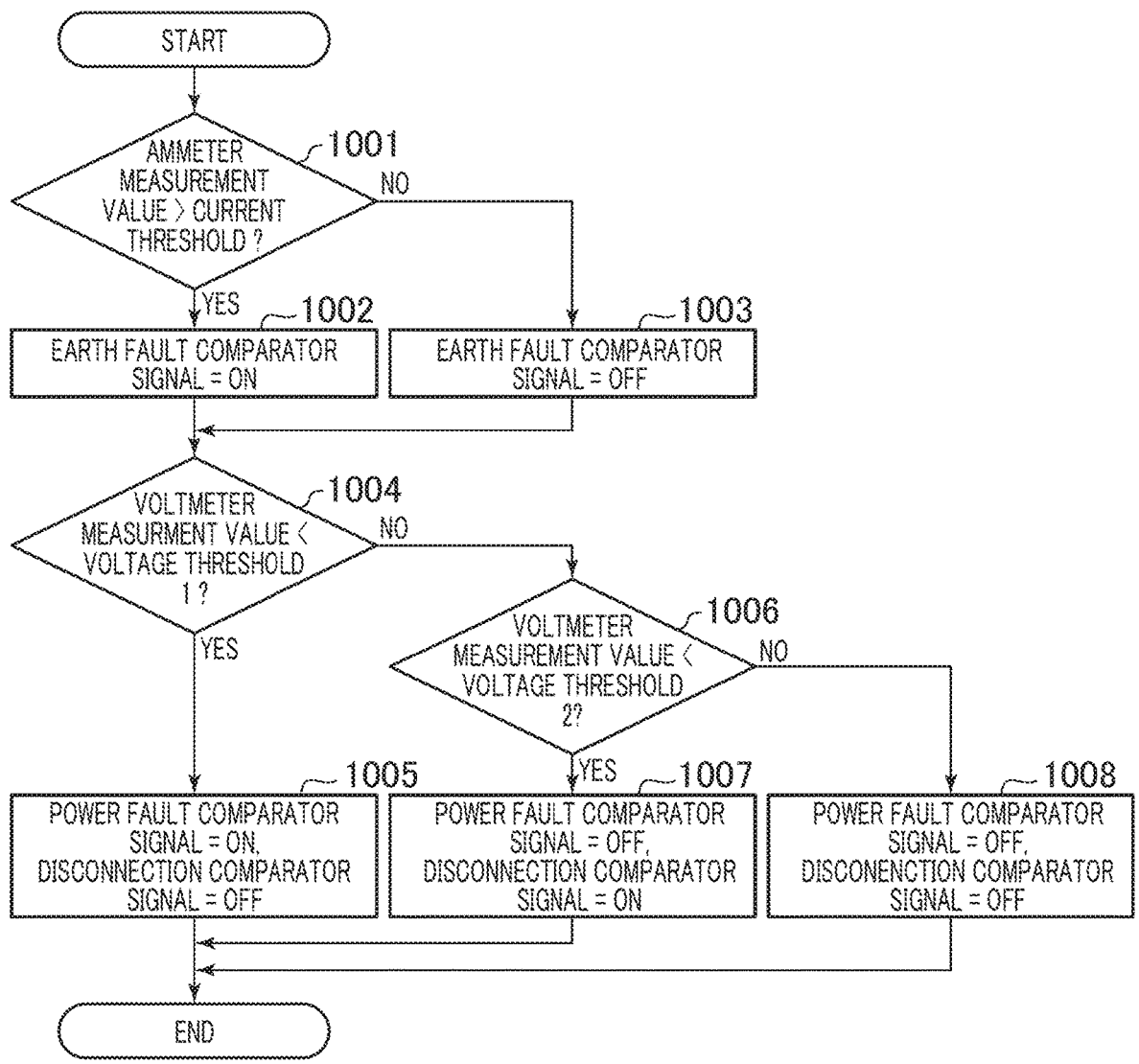
FIG. 10 is a flowchart in Step 201 of FIG. 2 where a circuit of the electronic control unit of FIG. 9 is applied.

In Step 1001 of FIG. 10, the earth fault comparator 916a determines whether an ammeter measurement value is larger than a current threshold. When the answer is Yes (the ammeter measurement value is larger than the current threshold) in Step 1001, the processing advances to Step 1002, where the earth fault comparator signal is set to ON. When the answer is No (the ammeter measurement value is not greater than the current threshold) in Step 1001, the processing advances to Step 1003, where the earth fault comparator signal is set to OFF.

In Step 1004, the power fault comparator 916b determines whether "a voltmeter measurement value is less than a voltage threshold 1. When the answer is Yes (the voltmeter measurement value is less than the voltage threshold 1) in Step 1004, the processing advances to Step 1005, where the power fault comparator signal is set to ON and the disconnection comparator signal is set to OFF, and the processing is ended. When the answer is No (the voltmeter measurement value is equal to or greater than the voltage threshold 1) in Step 1004, the processing advances to processing of Step 1006.

In Step 1006, the disconnection comparator 916c determines whether the voltmeter measurement value is less than a voltage threshold 2. When the answer is Yes (the voltmeter measurement value is less than the voltage threshold 2) in Step 1006, the processing advances to Step 1007, where the power fault comparator signal is set to OFF and the disconnection comparator signal is set to ON, and the processing is ended. When the answer is No (the voltmeter measurement value is equal to or greater than the voltage threshold 2) in Step 1006, the processing advances to Step 1008, where the power fault comparator signal is set to OFF and the disconnection comparator signal is set to OFF, and the processing is ended.

Figure 11:
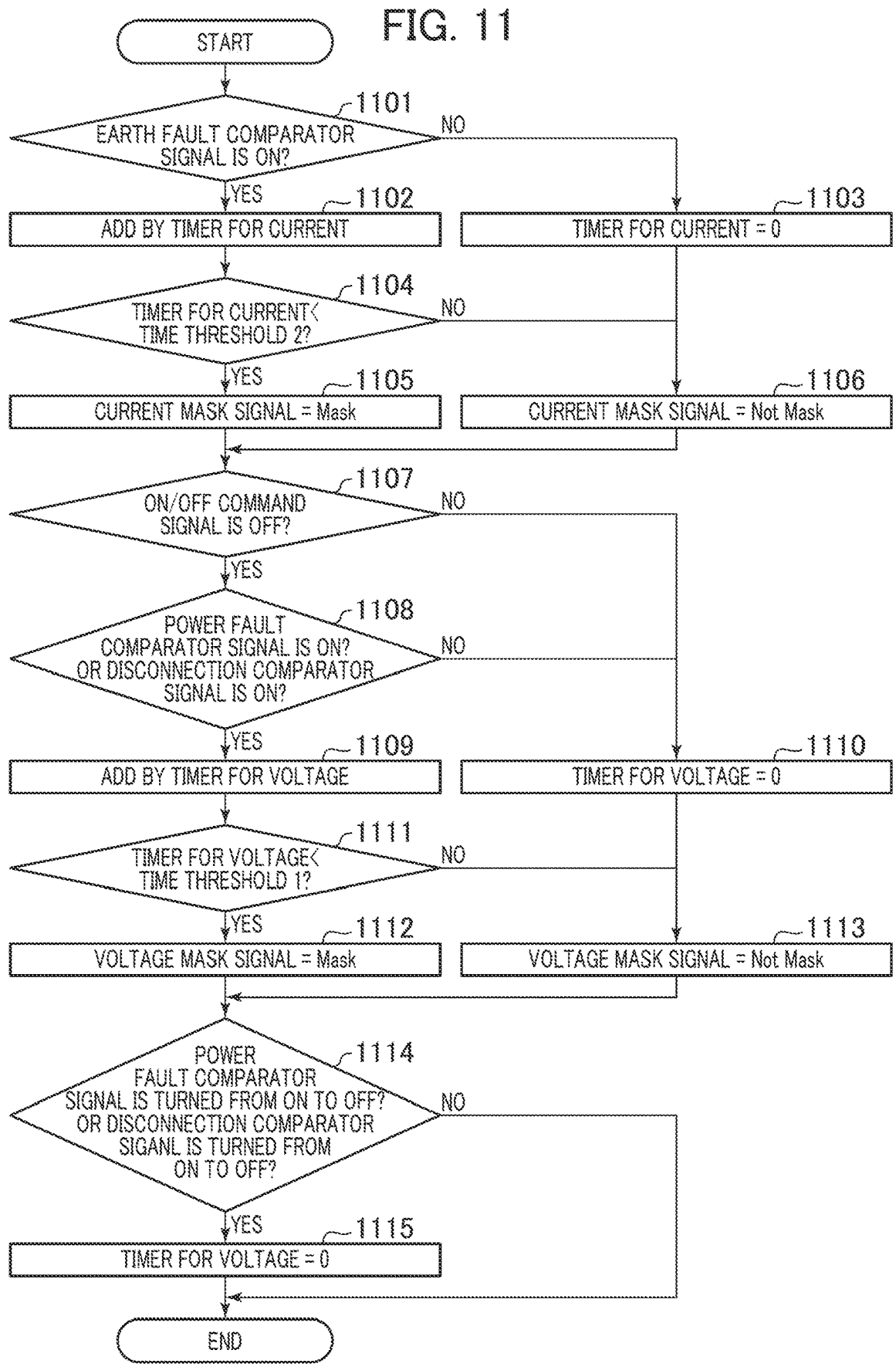
FIG. 11 is a flowchart in Step 202 shown in FIG. 2 where the circuit of the electronic control unit shown in FIG. 9 is applied.

FIG. 11 shows an example of the flowchart in Step 202 shown in FIG. 2 where the circuit of the electronic control unit 903 shown in FIG. 9 is applied.

In FIG. 11, it is determined in Step 1101 whether "the earth fault comparator signal ON" is correct. When the answer is Yes ("the earth fault comparator signal ON" is correct) in Step 1101, the processing advances to Step 1102, where a timer value of the timer 913 for current is added, and the processing advances to Step 1104. When the answer is No ("the earth fault comparator signal ON" is not correct) in Step 1101, the processing advances to Step 1103, where the timer value of the timer 913 for current is set to 0, and the processing advances to processing of Step 1106.

In Step 1104, the current mask determination part 915a determines whether "the timer for current is less than a time threshold 2. When the answer is Yes (the timer for current is less than the time threshold 2) in Step 1104, the processing advances to Step 1105, where the current mask signal is set to Mask. When the answer is No (the timer for current is equal to or greater than the time threshold 2) in Step 1104, the processing advances to Step 1106, where the current mask signal is set to Not Mask. After execution of Step 1105 and Step 1106, the processing advances to processing of Step 1107.

It is determined in Step 1107 whether "the ON/OFF command signal OFF" is correct. When the answer is Yes ("the ON/OFF command signal OFF" is correct) in Step 1107, the processing advances to Step 1108. When the answer is No ("the ON/OFF command signal OFF" is not correct) in Step 1107, the processing advances to processing of Step 1110.

It is determined in Step 1108 whether "the power fault comparator signal ON or the disconnection comparator signal ON" is correct. When the answer is Yes ("the power fault comparator signal ON or the disconnection comparator signal ON" is correct) in Step 1108, the processing advances to Step 1109, where a timer value of the timer 914 for voltage is added, and the processing advances to Step 1111. When the answer is No ("the power fault comparator signal ON or the disconnection comparator signal ON" is not correct) in Step 1108, the processing advances to Step 1110, where the timer 914 for voltage is set to 0, and the processing advances to processing of Step 1113.

In Step 1111, the voltage mask determination part 915b determines whether the timer for voltage is less than a time threshold 1. When the answer is Yes (the timer for voltage is less than the time threshold 1) in Step 1111, the processing advances to Step 1112, where the voltage mask signal is set to Mask. When the answer is No (the timer for voltage is equal to or greater than the time threshold 1) in Step 111, the processing advances to Step 1113, where the voltage mask signal is set to Not Mask. After execution of Step 1112 and Step 1113, the processing advances to processing of Step 1114.

It is determined in Step 1114 whether "the power fault comparator signal is turned from ON to OFF or the disconnection comparator signal is turned from ON to OFF" is correct. When the answer is Yes ("the power fault comparator signal is turned from ON to OFF or the disconnection comparator signal is turned from ON to OFF" is correct) in Step 1114, the processing advances to Step 1115, where the timer value of the timer 914 for voltage is set to 0, and the processing is ended. When the answer is No ("the power fault comparator signal is turned from ON to OFF or the disconnection comparator signal is turned from ON to OFF" is not correct) in Step 1114, the processing is ended without doing anything.

Next, a method of setting the voltage threshold 1, the voltage threshold 2, the current threshold, the time threshold 1, and the time threshold 2 used when generating the comparator signals and current and voltage mask signals of the disconnection, the earth fault, and the power fault in the processing shown in FIG. 10 and FIG. 11 will be described.

When the FET 912 shown in FIG. 9 is ON, both ends of the voltmeter 918 become equipotential, and hence, the measured voltage of the voltmeter 918 becomes 0[V] regardless of the normality and abnormality. Thus, it is not possible to identify the abnormality by using the voltmeter 918 in the state in which the FET 912 is ON.

On the other hand, when the FET 912 is OFF, the value measured by the voltmeter 918 at a normal time becomes 14[V] because of being a difference in potential between the power supply connection terminal 904 (14[V] because of being connected to the power supply 912) and the electromagnetic load drive output terminal 905 (0[V] because of being connected to ground).

When the electromagnetic load drive output terminal 905 is subjected to the ground fault, the value measured by the voltmeter 918 becomes 14[V] because of being a difference in potential between the electromagnetic load drive output terminal 905 (0[V] because of grounding) and the power supply connection terminal 904 (14[V] because of being connected to the power supply).

When the electromagnetic load drive output terminal 905 is disconnected, the value becomes 14-2.5=11.5[V] because of being a difference in potential between the electromagnetic load drive output terminal 905 (the constant voltage source 917=2.5[V] because of disconnection) and the power supply connection terminal 904 (14[V] because of being connected to the power supply).

When the electromagnetic load drive output terminal 905 is subjected to the power fault, the value becomes 0[V] because of being a difference in potential between the electromagnetic load drive output terminal 104 (the power supply 902=14[V] because of the power fault) and the power supply connection terminal 904 (14[V] because of being connected to the power supply 912).

Thus, in the case of both the normal time and the occurrence of the power fault together, the value of the voltmeter 918 becomes 14[V], and hence only the voltmeter 918 cannot distinguish therebetween.

Now, consider the values of the ammeter 919 at the normal time and the power fault time where the FET 912 is ON. At the normal time, a current of a resistance value of the electromagnetic load 901÷(the power supply 902=14[V]) flows. At the time of the earth fault, since the path from the electromagnetic load drive output terminal 904 to the power supply 902 becomes a state in which the resistance is almost absent, an overcurrent flows therethrough.

Further, since the reliability of the voltage value to be measured is required when the measured value of the voltmeter 918 is used for disconnection/power fault detection, it is necessary to set the time taken until the voltage value becomes stable after a change in the voltage, by the time threshold 1. It is not possible to perform the disconnection/power fault detection until the time threshold 1 elapses after the change in voltage. Even when the measurement value of the ammeter 919 is used for earth fault detection, reliability is required as with the voltage. It is therefore necessary to set the time taken until the value after a change in current becomes stable, by the time threshold 2. The earth fault detection cannot be performed until the time threshold 2 elapses after the change in current.

From the above results, the voltage threshold 1 to detect the power fault, the voltage threshold 2 to detect the disconnection, and the current threshold to detect the earth fault are set like, for example, the following equations (4) to (6).

$$\text{Voltage threshold 1} = \text{constant voltage source } 917(2.5[V]) \div 2 \quad (4)$$

$$\text{Voltage threshold 2} = \text{power supply } 902(14[V]) - (\text{constant voltage source } 917(2.5[V]) \div 2) \quad (5)$$

$$\text{Current threshold} = (\text{power supply } 902(14[V]) \div \text{electromagnetic load } 901 \text{ resistance value}) \times 2 \quad (6)$$

Further, the time threshold 1 and the time threshold 2 respectively set a sufficient stable time from the voltage/current changes in consideration of circuit characteristics.

Here, in the electronic control unit 903 of the second embodiment, the electromagnetic load 901 has one end connected to ground. The register 920 performs mask processing in which the information of the occurrence of the earth fault of the path from the FET 912 to the electromagnetic load 901 is detected based on the current output of the ammeter 919, and the detection is not performed when the current output of the ammeter 919 is unstable.

Thus, in the configuration of the high side driving system of FIG. 9, NG of the earth fault can be detected.

Here, in the electronic control unit 903 of the second embodiment, the electromagnetic load 901 has one end connected to ground, and the register 920 performs mask processing in which when the ON/OFF command signal is OFF, information of the occurrence of at least one of the disconnection and power fault of the path from the FET 912 to the electromagnetic load 901 is detected based on the voltage output of the voltmeter 918, and the detection is not performed when the ON/OFF command signal is ON, and the voltage output of the voltmeter 918 is unstable.

Thus, in the configuration of the electronic control unit based on the high side driving system of FIG. 9, NG of the disconnection and power fault can be detected.

Figure 12:
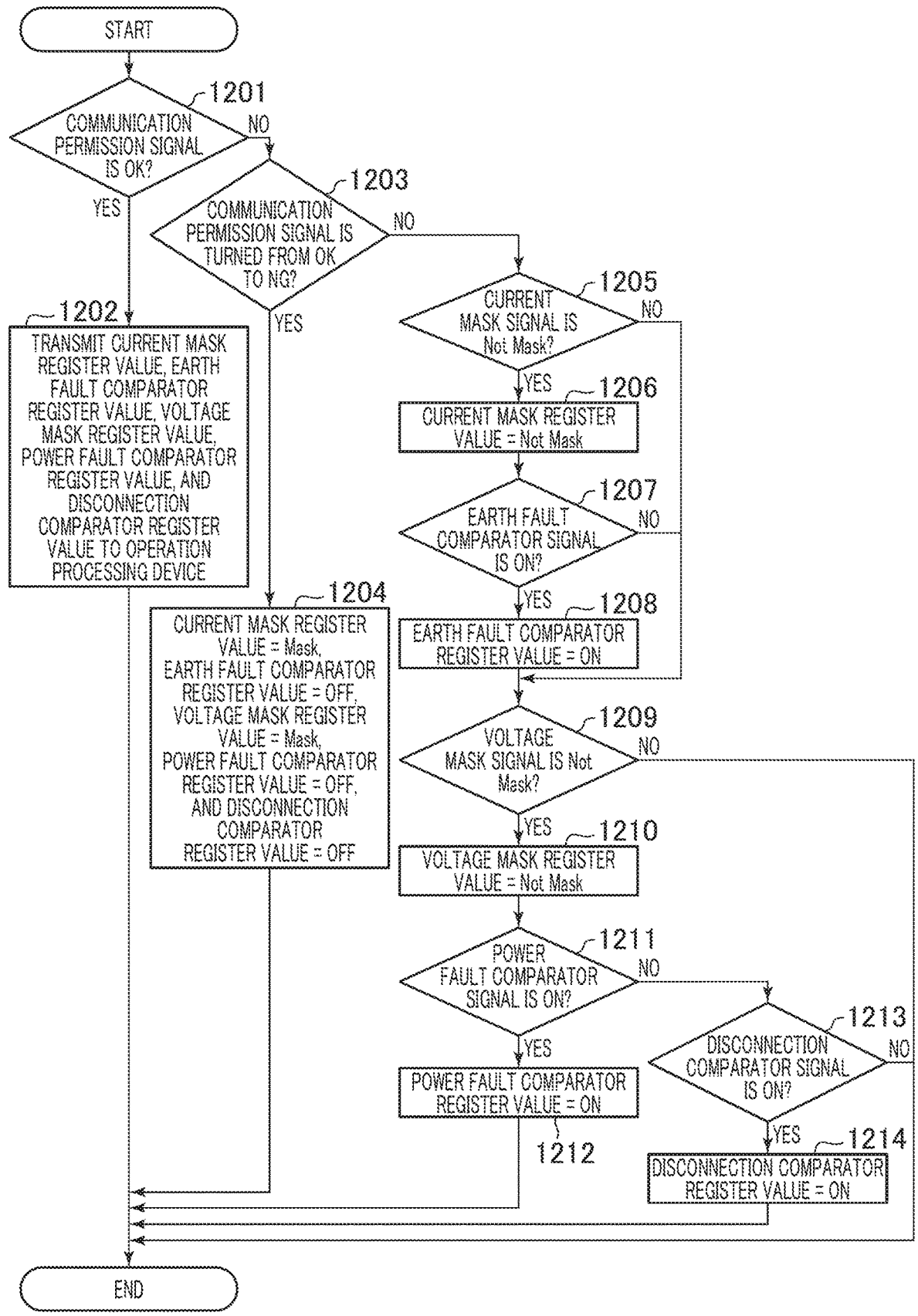
FIG. 12 is a flowchart in Step 204 shown in FIG. 2 where the circuit of the electronic control unit shown in FIG. 9 is applied.

FIG. 12 is a diagram showing an example of the flowchart in Step 204 shown in FIG. 2 where the circuit of the electronic control unit shown in FIG. 9 is applied.

In FIG. 12, it is determined in Step 1201 whether "the communication permission signal is OK" is correct. When the answer is Yes ("the communication permission signal is OK" is correct) in Step 1201, the processing advances to Step 1202, where the register values of the current mask register value 920a, the earth fault comparator register value 920b, the voltage mask register value 920c, the power fault comparator register value 920d, and the disconnection comparator register value 920e are transmitted to the operation processing device 906. When the answer is No ("the communication permission signal is OK" is not correct) in Step 1201, the processing advances to processing of Step 1203.

It is determined in Step 1203 whether "the communication permission signal is turned from OK to NG" is correct. When the answer is Yes ("the communication permission signal is turned from OK to NG" is correct) in Step 1203, the processing advances to Step 1204, where the current mask register value 920a is set to Mask, the earth fault comparator register value 920b is set to OFF, the voltage mask register value 920c is set to Mask, the power fault comparator register value 920d is set to OFF, and the disconnection comparator register value 920e is set to OFF. When the answer is No ("the communication permission signal is turned from OK to NG" is not correct) in Step 1203, the processing advances to processing of Step 1205.

It is determined in Step 1205 whether "the current mask signal is Not Mask" is correct. When the answer is Yes ("the current mask signal is Not Mask" is correct) in Step 1205, the processing advances to Step 1206, where the current mask register value 920a is set to Not Mask, and the processing advances to processing of Step 1207. When the answer is No ("the current mask signal is Not Mask" is not correct) in Step 1205, the processing advances to processing of Step 1209.

It is determined in Step 1207 whether "the earth fault comparator signal is ON" is correct. When the answer is Yes ("the earth fault comparator signal is ON" is correct) in Step 1207, the processing advances to Step 1208, where the earth fault comparator register value 920b is set to ON. When the answer is No ("the earth fault comparator signal is ON" is not correct) in Step 1207, and after processing of Step 1208, the processing advances to processing of Step 1209.

It is determined in Step 1209 whether "the voltage mask signal is Not Mask" is correct. When the answer is Yes ("the voltage mask signal is Not Mask" is correct) in Step 1209, the processing advances to Step 1210, where the voltage mask register value 920c is set to Not Mask, and the processing advances to processing of Step 1211. When the answer is No ("the voltage mask signal is Not Mask" is not correct) in Step 1209, the processing is ended without doing anything.

It is determined in Step 1211 whether "the power fault comparator signal is ON" is correct. When the answer is Yes ("the power fault comparator signal is ON" is correct) in Step 1211, the processing advances to Step 1212, where the power fault comparator register value 920d is set to ON. When the answer is No ("the power fault comparator signal is ON" is not correct) in Step 1211, the processing advances to processing of Step 1213.

It is determined in Step 1213 whether "the disconnection comparator signal is ON" is correct. When the answer is Yes ("the disconnection comparator signal is ON" is correct) in Step 1213, the processing advances to Step 1214, where the disconnection comparator register value 920e is set to ON, and the processing is ended. When the answer is No ("the disconnection comparator signal is ON" is not correct) in Step 1213, the processing is ended without doing anything.

Figure 13:
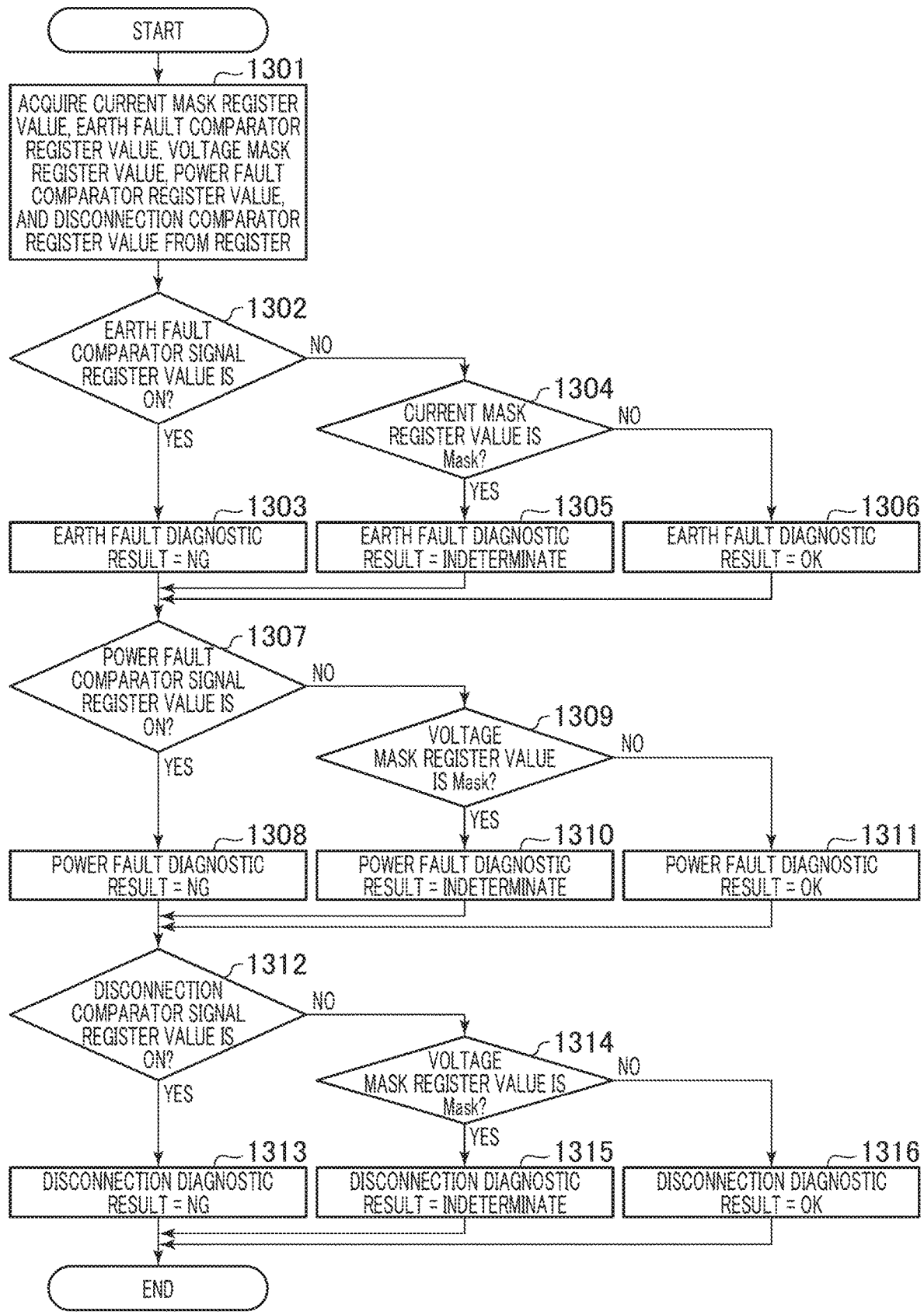
FIG. 13 is a flowchart in an operation processing device where the circuit of the electronic control unit shown in FIG. 9 is applied.

FIG. 13 shows an example of a flowchart in the operation processing device 906 where the circuit of the electronic control unit 903 shown in FIG. 9 is applied.

In FIG. 13, in Step 1301, the register values of the current mask register value 920a, the earth fault comparator register value 920b, the voltage mask register value 920c, the power fault comparator register value 920d, and the disconnection comparator register value 920e are acquired from the register 920, and the processing advances to Step 1302.

Processing of Steps 1302 to 1306 are executed in the earth fault diagnosis 911a.

It is determined in Step 1302 whether "the earth fault comparator signal register value is ON" is correct. When the answer is Yes ("the earth fault comparator signal register value is ON" is correct) in Step 1302, the processing advances to Step 1303 to set an earth fault diagnostic result to be NG, and advances to processing of Step 1307. When the answer is No ("the earth fault comparator signal register value is ON" is not correct) in Step 1302, the processing advances to the processing of Step 1304.

It is determined in Step 1304 whether "the current mask register value is Mask" is correct. When the answer is Yes ("the current mask register value is Mask" is correct) in Step 1304, the processing advances to Step 1305 to set an earth fault diagnostic result to be indeterminate. When the answer is No ("the current mask register value is Mask" is not correct) in Step 1304, the processing advances to Step 1306 to set an earth fault diagnostic result to be OK. After the processing of Step 1305 and Step 1306, the processing advances to the processing of Step 1307.

The processing of Steps 1307 to 1311 are executed in the power fault diagnosis 911b.

It is determined in Step 1307 whether "the power fault comparator signal register value is ON" is correct. When the answer is Yes ("the power fault comparator signal register value is ON" is correct) in Step 1307, the processing advances to Step 1308 to set a power fault diagnostic result to be NG, and advances to processing of Step 1312. When the answer is No ("the power fault comparator signal register value is ON" is not correct) in Step 1307, the processing advances to the processing of Step 1309.

It is determined in Step 1309 whether "the voltage mask register value is Mask" is correct. When the answer is Yes ("the voltage mask register value is Mask" is correct) in Step 1309, the processing advances to Step 1310 to set a power fault diagnostic result to be indeterminate. When the answer is No ("the voltage mask register value is Mask" is not correct) in Step 1309, the processing advances to Step 1311 to set a power fault diagnostic result to be OK. After the processing of Step 1310 and Step 1311, the processing advances to the processing of Step 1312.

The processing of Steps 1312 to 1316 are executed in the disconnection diagnosis 911c.

It is determined in Step 1312 whether "the disconnection comparator signal register value is ON" is correct. When the answer is Yes ("the disconnection comparator signal register value is ON" is correct) in Step 1312, the processing proceeds to Step 1313 to set a disconnection diagnostic result to be NG. When the answer is No ("the disconnection comparator signal register value is ON" is not correct) in Step 1312 in which the processing is ended, the processing proceeds to the processing of Step 1314.

It is determined in Step 1314 whether "the voltage mask register value is Mask" is correct. When the answer is Yes ("the voltage mask register value is Mask" is correct) in Step 1314, the processing proceeds to Step 1315 to set a disconnection diagnostic result to be indeterminate, and the processing is ended. When the answer is No ("the voltage mask register value is Mask" is not correct) in Step 1314, the processing proceeds to Step 1316 to set a disconnection diagnostic result to be OK, and the processing is ended.

Next, a timing chart of the second embodiment will be described using FIG. 14.

Figure 14:
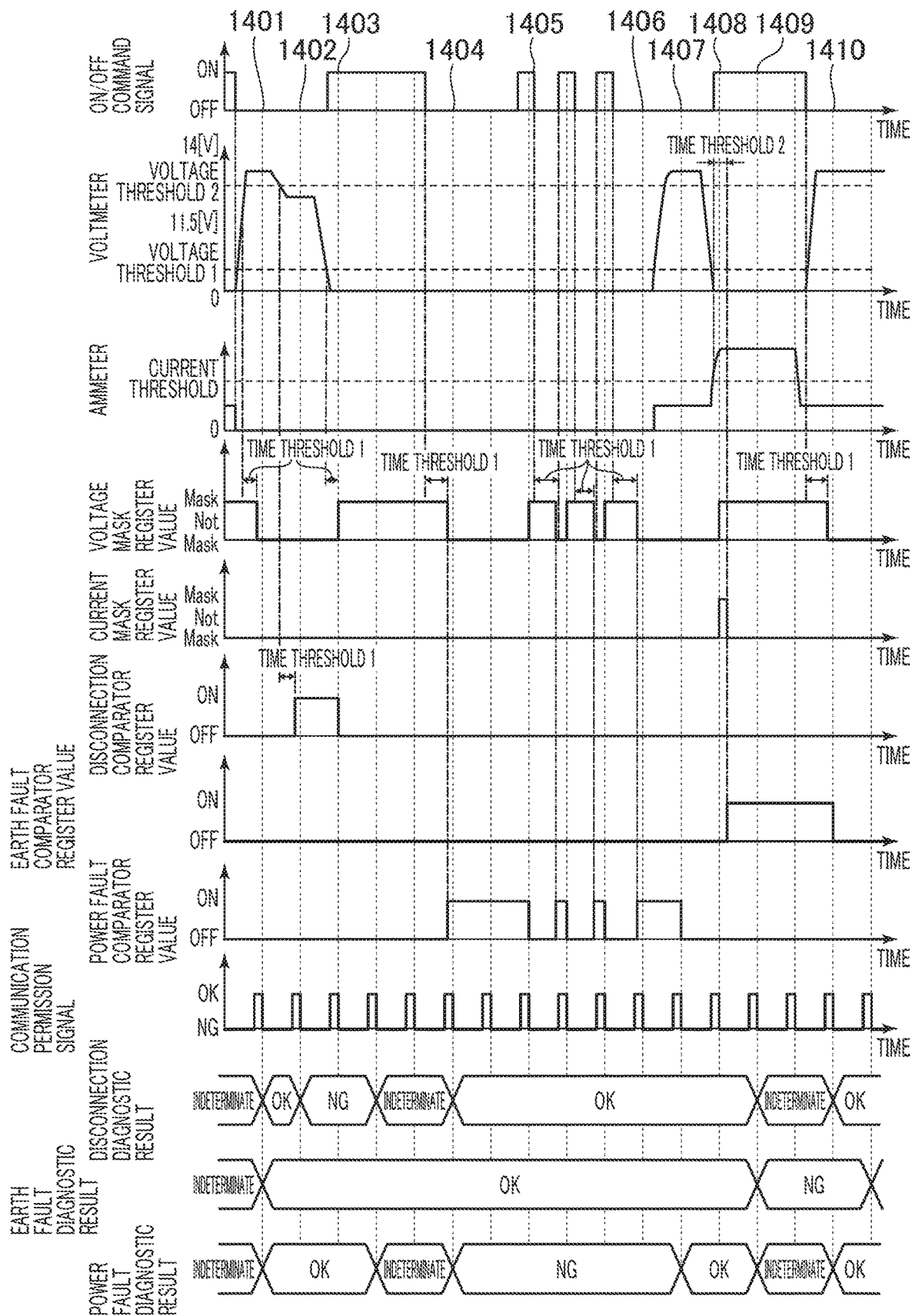
FIG. 14 is a timing chart in which the operation processing device identifies OK, NG and indetermination where disconnection, an earth fault, and a power fault in the circuit of the electronic control unit shown in FIG. 9 are generated.

FIG. 14 is a timing chart in which the operation processing device 906 identifies OK, NG, and indetermination where disconnection, an earth fault, and a power fault in the circuit of the electronic control unit 903 shown in FIG. 9 are generated.

In FIG. 14, the drive circuit 908 generates comparator register values (920b, 920d and 920e) and mask register values (920a and 920c) from the ON/OFF command signal, the measurement value of the voltmeter 918, and the measurement value of the ammeter 919 in accordance with the flowchart of FIG. 2 as with the first embodiment. The operation processing device 906 acquires the comparator register values (920b, 920d, and 920e) and the mask register values (920a and 920c) for each communication with the drive circuit 908 and identifies the three states of the disconnection, the earth fault, and the power fault in accordance with the flowchart shown in FIG. 13.

A time 1401 shown in FIG. 14 is a time at which the disconnection, the earth fault, and the power fault are not generated when the operation processing device 906 and the drive circuit 908 first communicate with each other in the electronic control unit 903. A time 1402 is a time at which the disconnection occurs at the time of communication between the operation processing device 906 and the drive circuit 908. A time 1403 is a time at which the power fault is generated at the time of communication, but the power fault cannot be identified yet by the drive circuit 908. A time 1404 is a time at which the ON/OFF command signal is turned from ON to OFF and hence the power fault can be identified. Times 1405 and 1406 are times at which the ON/OFF command signal is repeatedly turned ON/OFF in a cycle shorter than a communication interval. Further, times 1407 to 1410 are times taken until the earth fault is generated, and then restoring to a state in which the disconnection, the earth fault, and the power fault are not generated is done.

At the time 1401, since the voltage mask register value 920*c* is Not Mask, and the earth fault comparator register value 920*b* is OFF, the earth fault diagnostic result is OK. Further, since the voltage mask register value 920*c* is Not Mask, the disconnection comparator register value 920*e* is OFF, and the power fault comparator register value 920*d* is OFF, the disconnection and power fault diagnostic results of the operation processing device 906 become OK.

At the time 1402, the measurement value of the voltmeter 918 is reduced to less than the voltage threshold 2 and equal to or greater than the voltage threshold 1 from the time 1401, and the disconnection comparator register value 920*e* becomes ON. Since the voltage mask register value 920*c* is Not Mask, the disconnection diagnostic result of the operation processing device 906 becomes NG.

At the time 1403, the ON/OFF command signal becomes ON, the voltage mask register value 920*c* becomes Mask, and the disconnection comparator register value 920*e* becomes OFF. Therefore, the disconnection detection result of the operation processing device 906 becomes NG.

At the time 1404, the ON/OFF command signal becomes OFF, the power fault comparator register value 920*d* becomes ON, and the voltage mask register value 920*c* becomes Not Mask. The power fault diagnostic result of the operation processing device 906 becomes NG.

At the time 1405, the ON/OFF command signal becomes ON, the voltage mask register value 920*c* becomes Mask, and the power fault comparator register value 920*d* becomes OFF. Then, the ON/OFF command signal is turned OFF soon, and after the time threshold 1 elapses, the voltage mask register value 920*c* becomes Not Mask, and the power fault comparator register value 920*d* becomes ON. Thereafter, during the period up to the time 1406, the ON/OFF command signal is turned ON/OFF repeatedly in a cycle shorter than that for communication between the operation processing device 906 and the drive circuit 908, and the ON/OFF command signal becomes OFF again and then the time threshold 1 elapses, whereby the power fault comparator register value 920*d* becomes ON.

At the time 1407, the voltage mask register value 920*c* becomes Not Mask, the power fault comparator register value 920*d* becomes OFF, and hence the power fault diagnostic result of the operation processing device 906 becomes OK.

At the time 1408, the measurement value of the ammeter 919 exceeds the current threshold, but the time threshold 2 does not elapses, and hence, the voltage mask register value 920*c* becomes Mask, and the earth fault comparator register value 920*b* becomes OFF. At this time, the power fault diagnostic result of the operation processing device 906 becomes OK.

Thereafter, the time threshold 2 elapses after the measurement value exceeds the current threshold during the period up to the time 1409, and hence the voltage mask register value 920*c* becomes Mask, and the earth fault comparator register value 920*b* becomes ON. Thus, the earth fault diagnostic result of the operation processing device 906 becomes NG at the time 1409.

Since at the time 1410, the voltage mask register value 920*c* becomes Not Mask, the disconnection comparator register value 920*e* becomes OFF, and the power fault comparator register value 920*d* becomes OFF, the disconnection and power fault diagnostic results of the operation processing device 906 become OK.

Even in the second embodiment of the present invention as described above, an electronic control unit having a self-diagnosis function can be realized in which the operation processing device 906 is capable of identifying three states of OK, NG and indetermination of disconnection, an earth fault, and a power fault as with the first embodiment.

Incidentally, although the constant voltage source 117 or 917 has been used in the above-described first and second embodiments of the present invention, a circuit configuration free of these constant voltage source 117 or 119 is also possible. Thus, the constant voltage source is not necessarily required in the present invention.

Further, the above-described example is configured not to perform the diagnosis of the power fault, the earth fault, and the disconnection at the time of the mask processing when the ON/OFF command is in a predetermined state and the output value of the voltmeter (118, 918) or the ammeter (119, 919) is unstable (the output of the measurement unit is unstable). However, there is also considered a configuration in which even at the time of the mask processing, the diagnosis of the power fault, the earth fault, and the disconnection is performed, and only a result selected out of their diagnostic results is utilized.

Although the embodiments of the present invention have been described above in detail, the present invention is not limited to the aforementioned embodiments, and can be modified in various forms. Further, each constituent element is not limited to the above configuration so long as it does not impair the characteristic function of the present invention.

LIST OF REFERENCE SIGNS

101, 901 . . . electromagnetic load, 102, 902 . . . power supply, 103, 903 . . . ECU, 104, 905 . . . electromagnetic load drive output terminal, 105 . . . ground connection terminal, 106, 906 . . . operation processing device, 107, 907 . . . PWM generating unit, 108,908 . . . drive circuit, 109, 909 . . . Duty operation unit, 110, 910 . . . communication commanding unit, 111, 911 . . . diagnostic unit, 112, 912 . . . FET, 113, 913 . . . timer for current, 114, 914 . . . timer for voltage, 115, 915 . . . mask determination unit, 116, 916 . . . comparison unit, 117, 917 . . . constant voltage source, 118, 918 . . . voltmeter, 119, 919 . . . ammeter, 120, 920 . . . register, 904 . . . power supply connection terminal.

The invention claimed is:

1. An electronic control unit comprising:
a drive circuit which has: a measurement unit measuring a voltage of an end of an electromagnetic load connected to a power supply or ground, or a current of the electromagnetic load, and determining whether an abnormality occurs; and a storage unit storing therein abnormality occurrence information and information for distinguishing between a state in which the abnormality is not generated and a state in which the abnormality cannot be diagnosed, on the basis of a measurement output of the measurement unit, the drive circuit driving the electromagnetic load; and
an operation processing section which transmits an ON/OFF command signal for driving the electromagnetic load to the drive circuit, acquires the information for distinguishing between the state in which the abnormality is not generated and the state in which the abnormality cannot be diagnosed, from the storage unit of the drive circuit, and identifies the occurrence of the abnormality and the non-occurrence thereof to perform abnormality diagnosis.

2. The electronic control unit according to claim 1, wherein the drive circuit has a switching part which drives the electromagnetic load on the basis of the ON/OFF command signal, and the abnormality occurrence information is information indicative of occurrence of at least one of disconnection, an earth fault, and a power fault of a path from the switching part to the electromagnetic load.

3. The electronic control unit according to claim 1, wherein the drive circuit has a register which stores the abnormality occurrence information and the information for distinguishing between the state in which the abnormality is not generated and the state in which the abnormality cannot be diagnosed, and the operation processing section acquires the abnormality occurrence information and the information for distinguishing between the state in which the abnormality is not generated and the state in which the abnormality cannot be diagnosed, both of which being stored in the register, when the drive circuit communicates with the operation processing section, and then resets the same.

4. The electronic control unit according to claim 1, wherein the information for distinguishing between the state in which the abnormality is not generated and the state in which the abnormality cannot be diagnosed is a mask signal indicating whether or not to perform the abnormality diagnosis.

5. The electronic control unit according to claim 1, wherein when the abnormality occurrence information is indicative of abnormality occurrence, the operation processing section determines that the abnormality has occurred,
wherein when the abnormality occurrence information is not indicative of the abnormality occurrence, and the mask signal indicates executing of the abnormality diagnosis, the operation processing section determines that the abnormality has not been generated, and
wherein when the abnormality occurrence information is not indicative of the abnormality occurrence, and the mask signal indicates non-executing of the abnormality diagnosis, the operation processing section determines the diagnosis to be an indeterminate state.

6. The electronic control unit according to claim 4, wherein the mask signal indicates non-executing of the diagnosis when the output of the measurement unit is unstable.

7. The electronic control unit according to claim 2, wherein the drive circuit has a constant voltage source which is disposed between the electromagnetic load and the switching part and applies a constant voltage for disconnection detection.

8. The electronic control unit according to claim 2, wherein the electromagnetic load is connected to the power supply, the storage unit detects the occurrence of the power fault of the path from the switching part to the electromagnetic load on the basis of a current measured by the measurement unit, the information for distinguishing between the state in which the abnormality is not generated and the state in which the abnormality cannot be diagnosed is a mask signal indicative of whether or not to perform the abnormality diagnosis, and the mask signal indicates non-executing of the abnormality diagnosis when the current measurement output of the measurement unit is unstable.

9. The electronic control unit according to claim 2, wherein the electromagnetic load is connected to the power supply, the storage unit detects the occurrence of at least one of the disconnection and the earth fault of the path from the switching part to the electromagnetic load on the basis of a voltage measured by the measurement unit when the ON/OFF command signal indicates OFF, and the mask signal indicates non-executing of the abnormality diagnosis when the ON/OFF command signal is indicative of ON and the voltage measurement output of the measurement unit is unstable.

10. The electronic control unit according to claim 2, wherein the electromagnetic load is connected to the ground, the storage unit detects the occurrence of the earth fault of the path from the switching part to the electromagnetic load on the basis of a current measured by the measurement unit, the information for distinguishing between the state in which the abnormality is not generated and the state in which the abnormality cannot be diagnosed is a mask signal indicative of whether or not to perform the abnormality diagnosis, and the mask signal indicates non-executing of the abnormality diagnosis when the current measurement output of the measurement unit is unstable.

11. The electronic control unit according to claim 2, wherein the electromagnetic load is connected to the ground, the storage unit detects the occurrence of at least one of the disconnection and the power fault of the path from the switching part to the electromagnetic load on the basis of a voltage measured by the measurement unit when the ON/OFF command signal indicates OFF, and the mask signal indicates non-executing of the abnormality diagnosis when the ON/OFF command signal is indicative of ON and the voltage measurement output of the measurement unit is unstable.

* * * * *